(12) United States Patent
Kamata et al.

(10) Patent No.: US 9,437,300 B2
(45) Date of Patent: Sep. 6, 2016

(54) SEMICONDUCTOR MEMORY DEVICE

(71) Applicant: KABUSHIKI KAISHA TOSHIBA, Tokyo (JP)

(72) Inventors: Hideyuki Kamata, Kanagawa (JP); Toshifumi Minami, Kanagawa (JP); Teppei Higashitsuji, Kanagawa (JP); Atsuhiro Sato, Tokyo (JP); Keisuke Yonehama, Kanagawa (JP); Yasuyuki Baba, Kanagawa (JP); Hiroshi Shinohara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 14/469,251

(22) Filed: Aug. 26, 2014

(65) Prior Publication Data
US 2015/0262669 A1  Sep. 17, 2015

(30) Foreign Application Priority Data

Mar. 14, 2014  (JP) .................................. 2014-052079

(51) Int. Cl.
| | | |
|---|---|---|
| *G11C 16/08* | (2006.01) | |
| *H01L 27/115* | (2006.01) | |
| *G11C 16/04* | (2006.01) | |
| *G11C 5/02* | (2006.01) | |
| *G11C 16/12* | (2006.01) | |
| *G11C 16/34* | (2006.01) | |

(52) U.S. Cl.
CPC ........... *G11C 16/0483* (2013.01); *G11C 5/025* (2013.01); *G11C 16/08* (2013.01); *G11C 16/12* (2013.01); *G11C 16/3459* (2013.01); *H01L 27/1157* (2013.01); *H01L 27/11582* (2013.01)

(58) Field of Classification Search
CPC ............. G11C 16/0466; G11C 16/08; H01L 27/11573; H01L 27/11578; H01L 27/1158; H01L 27/11582
See application file for complete search history.

(56) References Cited

U.S. PATENT DOCUMENTS

| | | | |
|---|---|---|---|
| 8,030,700 B2* | 10/2011 | Sakamoto | ......... H01L 27/11578 257/306 |
| 8,189,371 B2* | 5/2012 | Katsumata | ......... G11C 16/0483 365/161 |
| 2007/0206398 A1* | 9/2007 | Nakamura | ........ H01L 27/11519 365/51 |
| 2012/0140562 A1* | 6/2012 | Choe | .................... H01L 27/1157 365/185.18 |
| 2013/0070530 A1* | 3/2013 | Chen | ...................... G11C 5/063 365/185.11 |
| 2014/0108705 A1* | 4/2014 | Gorobets | ........... G11C 16/3431 711/103 |

FOREIGN PATENT DOCUMENTS

| | | |
|---|---|---|
| JP | 2011-258289 A | 12/2011 |
| TW | 201407631 A | 2/2014 |

OTHER PUBLICATIONS

TW Office Action dated Nov. 17, 2015 for Application No. 103122865.

* cited by examiner

*Primary Examiner* — Allison P Bernstein
(74) *Attorney, Agent, or Firm* — Patterson & Sheridan, LLP

(57) ABSTRACT

A semiconductor memory device includes first and second memory cell transistors, first and second word lines electrically connected to the first and second memory cell transistors, respectively, first and second transfer transistors. The first and second transistors are electrically connected to the first and second word lines, respectively. The sizes of the first transistor and the second transistor are different.

20 Claims, 36 Drawing Sheets

SEMICONDUCTOR MEMORY DEVICE

CROSS-REFERENCE TO RELATED APPLICATION

This application is based upon and claims the benefit of priority from Japanese Patent Application No. 2014-052079, filed Mar. 14, 2014, the entire contents of which are incorporated herein by reference.

FIELD

Embodiments described herein relate generally to a semiconductor memory device.

BACKGROUND

In recent years, a NAND type flash memory where memory cells are arranged three-dimensionally has been developed.

DETAILED DESCRIPTION

Figure 1:
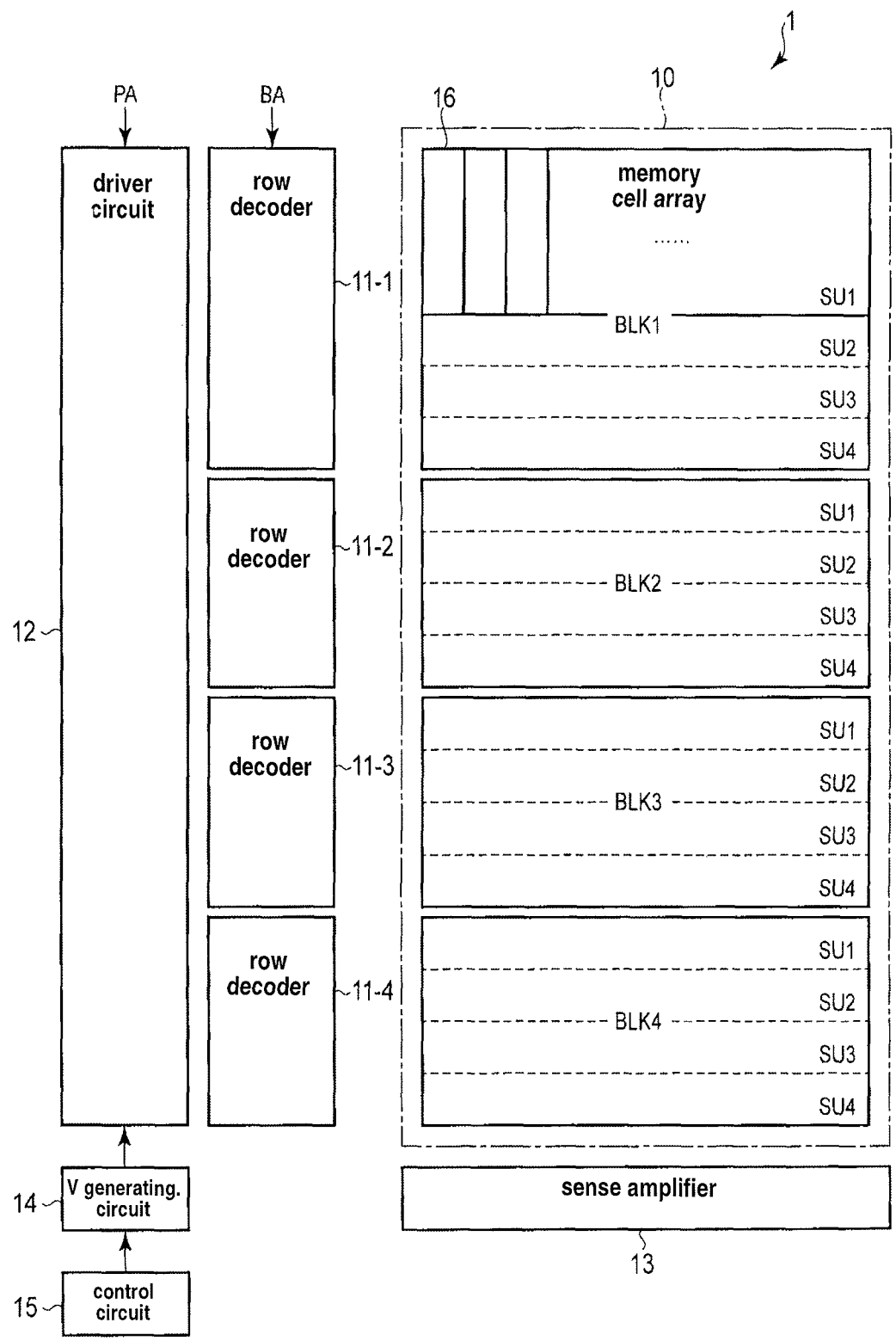
FIG. 1 is a block diagram of a semiconductor memory device according to a first embodiment.

The present embodiment now will be described more fully hereinafter with reference to the accompanying drawings, in which various embodiments are illustrated. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompass both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross sections and perspective illustrations that are schematic illustrations of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

The embodiment provides a semiconductor memory device having a compact area design.

In general, according to one embodiment, a semiconductor memory device includes first and second memory cell transistors, first and second word lines electrically connected to the first and second memory cell transistors, respectively, and first and second transfer transistors electrically connected to the first and second word lines, respectively. The sizes of the first transistor and the second transistor are different.

Below, description will be given of the embodiments with reference to the drawings. In the following description, common reference numerals are given to common portions across all of the drawings.

1. First Embodiment

Description will be given of a semiconductor memory device according to a first embodiment. In the following description, a three-dimensional stacked NAND type flash memory where memory cells are stacked on a semiconductor substrate will be described as an example of the semiconductor memory device.

1.1 Configuration of Semiconductor Memory Device

Firstly, description will be given of a configuration of the semiconductor memory device according to the present embodiment.

1.1.1 Overall Configuration of Semiconductor Memory Device

FIG. 1 is a block diagram of the semiconductor memory device according to the present embodiment. As illustrated in the diagram, a NAND type flash memory 1 is provided with a memory cell array 10, row decoders 11 (11-1 to 11-4), a driver circuit 12, a sense amplifier 13, a voltage generating circuit 14, and a control circuit 15.

The memory cell array 10 is provided with a plurality (four in the present example) of blocks BLK (BLK1 to BLK4) which are each a collection of nonvolatile memory cells. Data in the same block BLK is erased in a batch. Each of the blocks BLK is provided with a plurality (four in the present example) of string units SU (SU1 to SU4) which are each a collection of NAND strings 16 in each of which memory cells are connected in series. Naturally, the number of the blocks in the memory cell array 10 and the number of the string units in the block BLK are arbitrary.

The row decoders 11-1 to 11-4 are provided corresponding to the blocks BLK1 to BLK4 respectively and select a row of the corresponding block BLK.

The driver circuit 12 supplies a voltage which is necessary for writing, reading, and erasing data to the row decoders 11. The voltage is applied to the memory cells by the row decoders 11.

The sense amplifier 13 senses or amplifies data which is read from the memory cells when the data is read. In addition, the sense amplifier 13 transfers written data to the memory cells when the data is written.

The voltage generating circuit 14 generates a voltage which is necessary for writing, reading, and erasing data and supplies the voltage to the driver circuit 12.

The control circuit 15 controls the operation of the entire NAND type flash memory.

Figure 2:
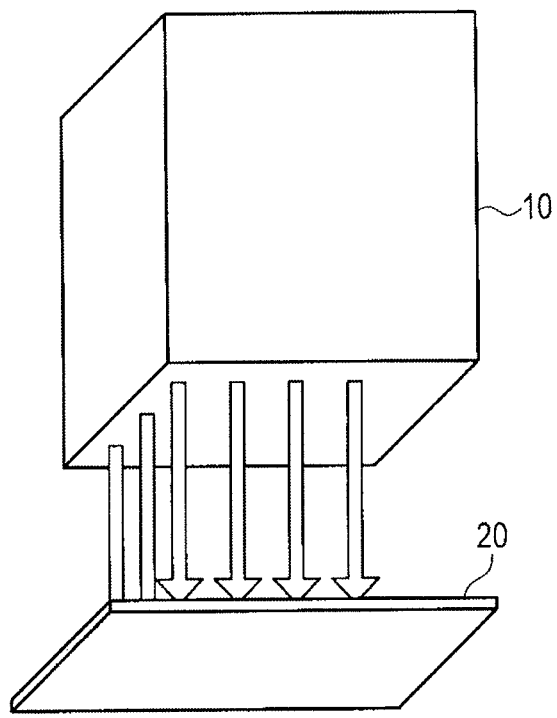
FIG. 2 is a block layout diagram of the semiconductor memory device according to the first embodiment.

FIG. 2 is a block layout diagram of the memory cell array 10 and a peripheral circuit 20 below the semiconductor substrate. The peripheral circuit 20 is provided with at least one of the row decoders 11-1 to 11-4, the driver circuit 12, the sense amplifier 13, the voltage generating circuit 14, and the control circuit 15 which are illustrated in FIG. 1. The peripheral circuit 20 is two-dimensionally arranged on the plane of the semiconductor substrate. Then, the memory cell array 10 is three-dimensionally formed above the peripheral circuit 20 and is electrically connected with the peripheral circuit 20.

The arrangement of the memory cell array 10 and the peripheral circuit 20 is, for example, described in "Semiconductor Memory Device" in U.S. patent application Ser. No. 13/351,737, filed Jan. 17, 2012; the entire contents of which are incorporated herein by reference.

1.1.2 Memory Cell Array 10

Figure 3:
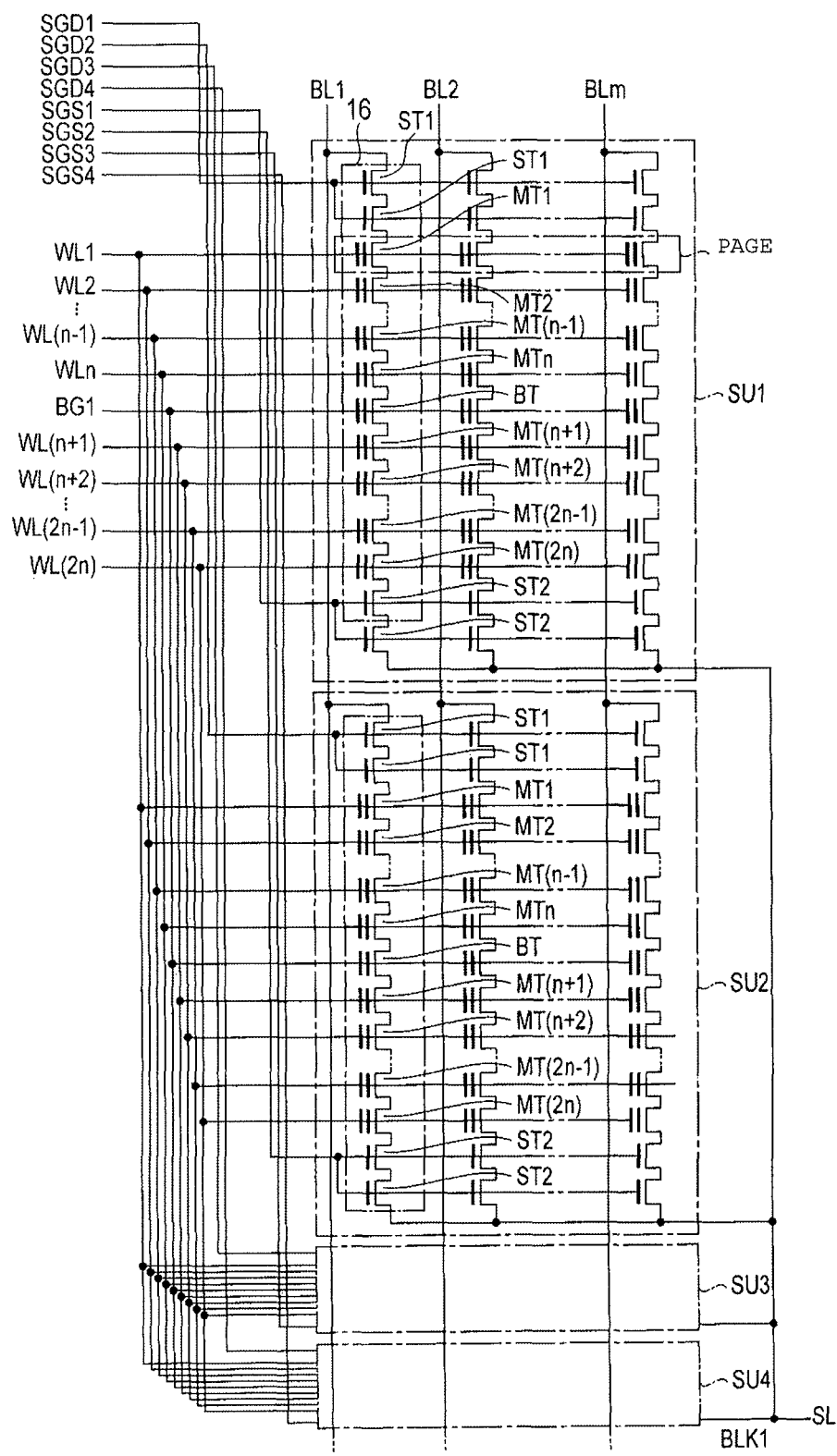
FIG. 3 is a circuit diagram of a memory cell array according to the first embodiment.

Next, detailed description will be given of a configuration of the memory cell array 10 described above. FIG. 3 is a circuit diagram of the block BLK1. The blocks BLK2 to BLK4 also have the same configuration.

As illustrated in the diagram, the block BLK1 includes four string units SU. In addition, each of the string units SU includes m (m is a natural number) NAND strings 16.

Each of the NAND strings 16 includes, for example, 2n (n is a natural number such as 4, 8, 16, 32, 64, or the like) memory cell transistors MT (MT1 to MT(2n)), two select transistors ST1, two select transistors ST2, and a back gate transistor BT. Here, the number of each of the select transistors ST1 and ST2 is arbitrary. The back gate transistor BT is also provided with a layered gate which includes a control gate and a charge storage layer in the same manner as the memory cell transistors MT. However, the back gate transistor BT is not for holding data, but simply functions as a current path when data is written and erased. The two select transistors ST1 and the two select transistors ST2 are respectively connected in series and the memory cell transistors MT and the back gate transistor BT are arranged such that the current path thereof is connected in series between the select transistors ST1 and ST2. Here, the back gate transistor BT is provided between the memory cell transistors MTn and MT(n+1). The current path of the memory cell transistor MT1 on one end side in the series connection is connected with one end of the current path of the select transistor ST1 and the current path of the memory cell transistor MT(2n) on the other end side is connected with one end of the current path of the select transistor ST2.

The gates of each of the select transistors ST1 of the string units SU1 to SU4 are respectively connected in common with selection gate lines SGD1 to SGD4 and the gates of the select transistors ST2 are each connected in common with selection gate lines SGS1 to SGS4. In contrast to this, the control gates of the memory cell transistors MT1 to MT(2n) in the same block BLK1 are respectively connected in common with word lines WL1 to WL(2n) and the control gates of the back gate transistor BT are connected in common with back gate lines BG (each of BG1 to BG4 in the blocks BLK1 to BLK4).

That is, while the word lines WL1 to WL(2n) and the back gate lines BG are connected in common between a plurality of the string units SU1 to SU4 in the same block BLK1, the selection gate lines SGD and SGS are independent in each of the string units SU1 to SU4 even in the same block BLK1.

In addition, out of the NAND strings 16 which are arranged in a matrix form inside the memory cell array 10, the other end of the current path of the two select transistors ST1, which are connected in series, of the NAND string 16 in the same line is connected in common with any of bit lines BL (BL1 to BLm). That is, the bit lines BL connect the NAND strings 16 in common among a plurality of the blocks BLK. In addition, the other end of the current path of the two select transistors ST2 which are connected in series is connected in common with a source line SL. The source line SL, for example, connects the NAND strings 16 in common among a plurality of the blocks.

As described above, data of the memory cell transistor MT inside the same block BLK is erased in a batch. In contrast to this, reading and writing of data are performed collectively for a plurality of the memory cell transistors MT which are connected in common with any of the word lines WL in any of the string units SU of any of the blocks BLK. This unit is called a "page".

Figure 4:
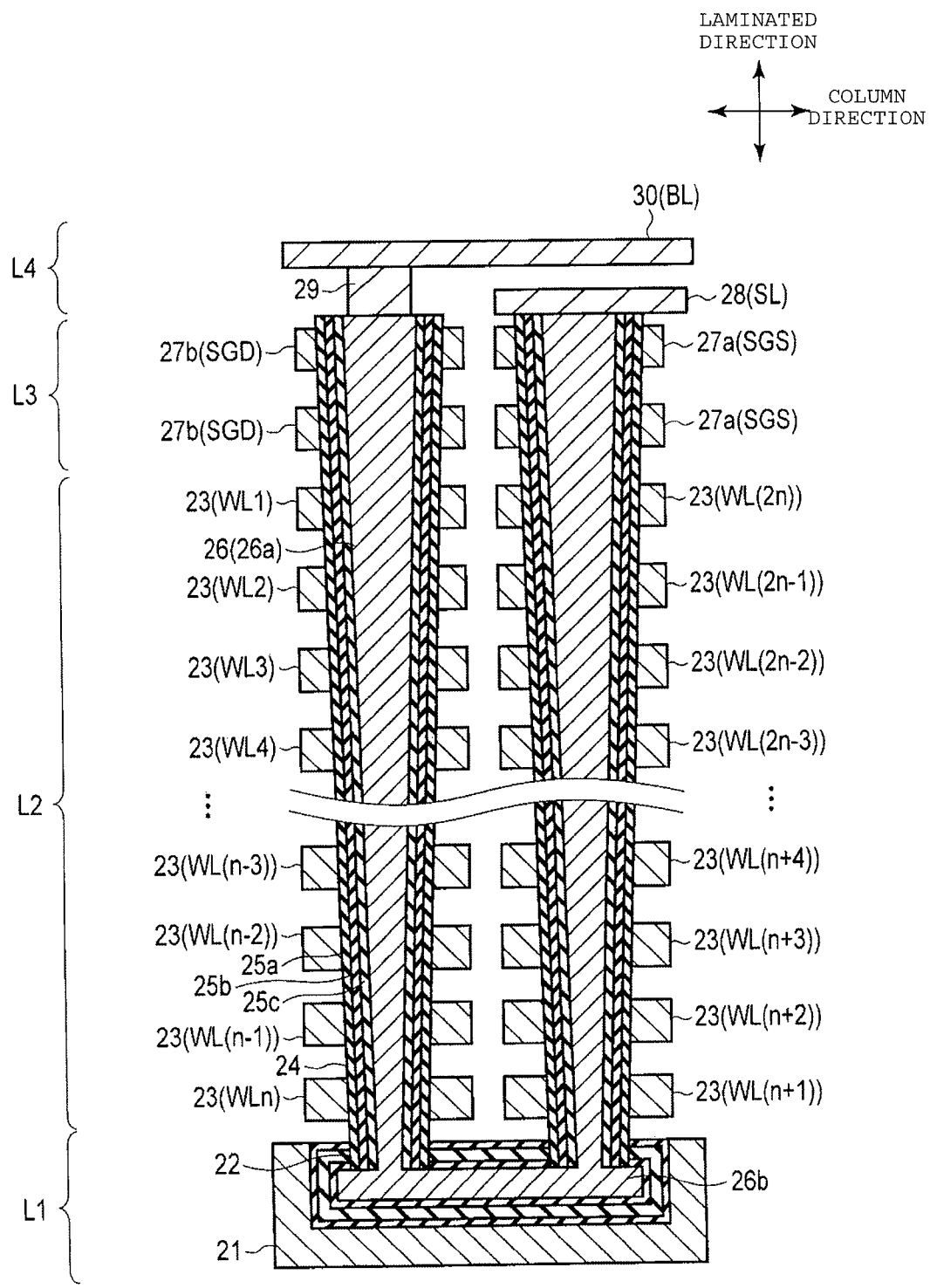
FIG. 4 is a cross-sectional diagram of the memory cell array according to the first embodiment.

Next, detailed description will be given of the configuration of the NAND strings 16 described above. FIG. 4 is a cross-sectional diagram of the NAND strings 16.

The NAND string 16 has a three-dimensional stacked structure as illustrated in FIG. 4 and has a back gate transistor layer L1, a memory cell transistor layer L2, a select transistor layer L3, and a wiring layer L4 which are formed in order above the semiconductor substrate.

The back gate transistor layer L1 functions as the back gate transistor BT. The memory cell transistor layer L2 functions as memory cell transistors MT1 to MT(2n) (the NAND string 16). The select transistor layer L3 functions as select transistors ST1 and ST2. The wiring layer L4 functions as the source line SL and the bit lines BL.

The back gate transistor layer L1 includes a back gate conductive layer 21. The back gate conductive layer 21 is formed so as to two-dimensionally extend in the row direction which is parallel to the semiconductor substrate and in the column direction. The back gate conductive layer 21 is divided for each of the blocks BLK. The back gate conductive layer 21 is formed by, for example, a polycrystal silicon. The back gate conductive layer 21 functions as the back gate lines BG.

The memory cell transistor layer L2 is formed on the upper layer of the back gate transistor layer L1. The memory cell transistor layer L2 has a word line conductive layer 23. The n layers of the word line conductive layers 23 are formed with interlayer insulating film layers (which are not illustrated in the diagram) that are interposed therebetween. The word line conductive layer 23 is formed in a stripe shape which has a predetermined pitch in the column direction and which extends in the row direction. The word line conductive layer 23 is formed by, for example, polycrystal silicon. The word line conductive layer 23 functions as the control gates (word lines WL1 to WL(2n)) of the respective memory cell transistors MT1 to MT(2n).

The select transistor layer L3 is formed on the upper layer of the memory cell transistor layer L2. The select transistor layer L3 has conductive layers 27a and 27b. The conductive layers 27a and 27b are formed as two layers with an interlayer insulating film layer interposed therebetween. The conductive layers 27a and 27b are formed in a stripe shape which extends in the row direction so as to have a predetermined pitch in the column direction. A pair of the conductive layers 27a and a pair of the conductive layers 27b are alternately arranged in the column direction. The conductive layer 27a is formed on the upper layer of one word line conductive layer 23 and the conductive layer 27b is formed on the upper layer of the other word line conductive layer 23. The conductive layers 27a and 27b are formed by, for example, polycrystal silicon. The conductive layer 27a functions as a gate (the selection gate line SGS) of the select transistor ST2 and the conductive layer 27b functions as a gate (the selection gate line SGD) of the select transistor ST1. The reason that the conductive layers 27a and 27b are each provided as two layers at a time is in order to form the select transistors ST1 and ST2 to be a necessary size. That is, a certain film thickness or more is necessary for the selection gate lines SGD and SGS and the film thickness is larger than the conductive layer 23 which is a word line WL. However, when the film thicknesses of the conductive layers 27a and 27b are large, a memory hole which passes through the conductive layers 27a and 27b has a taper shape and the characteristics deteriorate. Therefore, the two conductive layers 27a and the two conductive layers 27b where the film thickness is comparatively small are formed, the select transistor ST2 is configured with the two layers of the conductive layers 27a, and the select transistor ST1 is configured with the two layers of the conductive layers 27b. Owing to this, it is possible to prevent the characteristic deterioration in the select transistors ST1 and ST2 by the taper shape. Thus, two select transistors ST1 are illustrated in each of the NAND strings 16 in the equivalent circuit in FIG. 3; however, the above two select transistors ST1 substantially function as one transistor and this applies to the select transistors ST2 in the same manner.

In addition, the memory cell transistor layer L2 and the select transistor layer L3 have a memory hole 24. The memory hole 24, for example, reaches the back gate transistor layer L1 by passing through the conductive layer 27b and the word lines WL1 to WLn and another memory hole 24 reaches the back gate transistor layer L1 by passing through the conductive layer 27a and WL(n+1) to WL(2n). In addition, the memory holes 24 are formed so as to match with the vicinity of the end section in the column direction of the back gate conductive layer 21.

Furthermore, the back gate transistor layer L1, the memory cell transistor layer L2, and the select transistor layer L3 have a block insulating layer 25a, a charge storage layer 25b, a tunnel insulating layer 25c, and a semiconductor layer 26 as illustrated in FIG. 4. The semiconductor layer 26 functions as a body of the NAND strings 16 (a back gate of each of the transistors).

The block insulating layer 25a is formed with a predetermined thickness on the side wall which faces a back gate hole 22 and the memory hole 24 as illustrated in FIG. 4. The charge storage layer 25b is formed with a predetermined thickness on the side surface of the block insulating layer 25a. The tunnel insulating layer 25c is formed with a predetermined thickness on the side surface of the charge storage layer 25b. The semiconductor layer 26 is formed so as to come into contact with the side surface of the tunnel insulating layer 25c. The semiconductor layer 26 is formed so as to fill up the back gate hole 22 and the memory hole 24.

The semiconductor layer 26 is formed in a U shape when seen from the row direction. That is, the semiconductor layer 26 has a pair of columnar sections 26a which extend in a direction which is orthogonal with regard to the surface of the semiconductor substrate and a linking section 26b which links the bottom ends of the pair of the columnar sections 26a.

The block insulating layer 25a and the tunnel insulating layer 25c are formed by, for example, silicon oxide ($SiO_2$). The charge storage layer 25b is formed by, for example, silicon nitride (SiN). The semiconductor layer 26 is formed by, for example, polycrystal silicon. The block insulating layer 25a, the charge storage layer 25b, the tunnel insulating layer 25c, and the semiconductor layer 26 form a MONOS-type transistor which functions as the memory cell transistor MT.

To describe the configuration of the back gate transistor layer L1 described above in other words, the tunnel insulating layer 25c is formed so as to surround the linking section 26b. The charge storage layer 25b is formed so as to surround the tunnel insulating layer 25c. The block insulating layer 25a is formed so as to surround the charge storage layer 25b. The back gate conductive layer 21 is formed so as to surround the block insulating layer 25a.

In addition, to describe the configuration of the memory cell transistor layer L2 and the select transistor layer L3 described above in other words, the tunnel insulating layer 25c is formed so as to surround the columnar sections 26a. The charge storage layer 25b is formed so as to surround the tunnel insulating layer 25c. The block insulating layer 25a is formed so as to surround the charge storage layer 25b. The word line conductive layer 23 and the conductive layers 27a and 27b are formed so as to surround the block insulating layer 25a.

The wiring layer L4 is formed on the upper layer of the select transistor layer L3 as illustrated in FIG. 4. The wiring layer L4 has a source line layer 28, a plug layer 29, and a bit line layer 30.

The source line layer 28 is formed in a plate shape which extends in the row direction. The source line layer 28 is formed so as to come into contact with the upper surface of the pair of the conductive layers 27a which are adjacent in the column direction. The plug layer 29 comes into contact with the upper surface of the conductive layers 27b and is formed so as to extend in an orthogonal direction with regard to the surface of the semiconductor substrate. The bit line layer 30 is formed in a stripe shape which has a predetermined pitch in the row direction and which extends in the column direction. The bit line layer 30 is formed so as to come into contact with the upper surface of the plug layer 29. The source line layer 28, the plug layer 29, and the bit line layer 30 are formed by, for example, metals such as tungsten (W). The source line layer 28 functions as the source line SL illustrated in FIG. 1 and FIG. 3 and the bit line layer 30 functions as the bit lines BL illustrated in FIG. 1 and FIG. 3.

The configuration of the memory cell array 10 is described in "Three Dimensional Stacked Nonvolatile Semiconductor Memory" in U.S. patent application Ser. No. 12/407,403, filed Mar. 19, 2009. In addition, the configuration is also described in "Three Dimensional Stacked Nonvolatile Semiconductor Memory" in U.S. patent application Ser. No. 12/406,524, filed Mar. 18, 2009, "Non-Volatile Semiconductor Storage Device and Method of Manufacturing the Same" in U.S. patent application Ser. No. 12/679,991, filed Mar. 25, 2010, and "Semiconductor Memory and Method for Manufacturing Same" in U.S. patent application Ser. No. 12/532,030, filed Mar. 23, 2009; the entire contents of which are incorporated herein by reference.

1.1.2.1 Shape of Memory Hole 24

Figure 5:
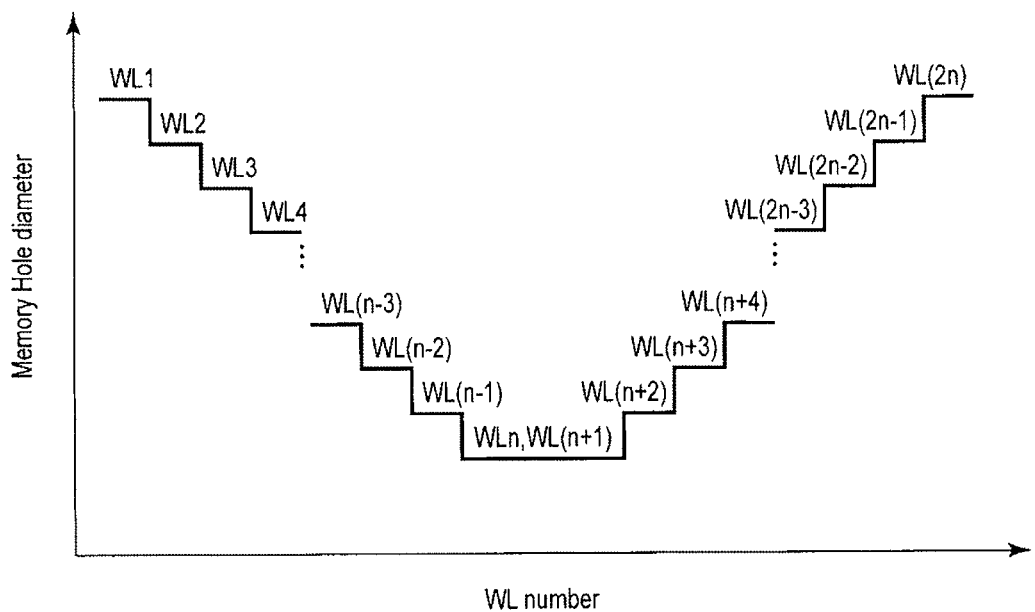
FIG. 5 is a graph which illustrates a relationship between word lines and memory hole diameters which correspond thereto according to the first embodiment.
Figure 6:
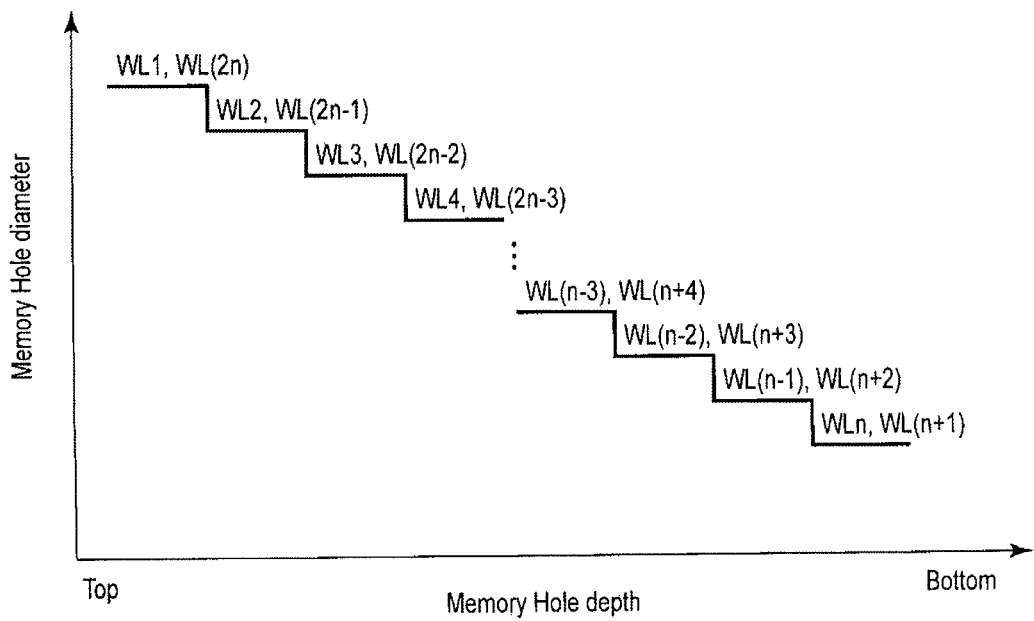
FIG. 6 is a graph which illustrates a relationship between a depth and a diameter of the memory hole according to the first embodiment.

Next, description will be given of a relationship between the shape of the memory hole 24, a diameter Di of the memory hole 24 which is formed in the word line WLi (i is an arbitrary number from 1 to 2n), and the size of the memory cell transistor MTi. FIG. 5 is a graph which illustrates a relationship between the word lines WL and the diameter D of the corresponding memory hole 24 and FIG. 6 is a graph which illustrates a relationship between the depth and the diameter of the memory hole 24.

As illustrated in FIG. 4, the memory hole 24 does not have an orthogonal shape where the inclination angle of the side wall with regard to the semiconductor substrate plane is 90 degrees, but has a shape where the inclination angle is 90 degrees or less (here, referred to as a taper shape). Accordingly, as illustrated in FIG. 5, the diameter D of the memory hole 24 which is formed in the word line WL which is positioned on the upper layer is larger than that of the memory hole 24 which is formed in the word line WL which is positioned on the lower layer. More specifically, when focusing on the memory hole 24 which is formed in the word lines WL1 to WLn, a relationship where D1>D2> . . . >Dn is established. In the same manner, when focusing on the memory hole 24 which is formed on the word lines WL(n+1) to WL(2n), a relationship where D(n+1)< D(n+2)< . . . <D(2n) is established. Then, as illustrated in FIG. 6, for example, as in the word lines WL1 and WL(2n), the diameters D of the memory holes 24 which are formed in the word lines WL which are positioned on the same layer are the same size (or substantially the same) as each other. Then, the diameter D of the memory hole 24 is smaller as the layers are positioned lower.

Figure 7:
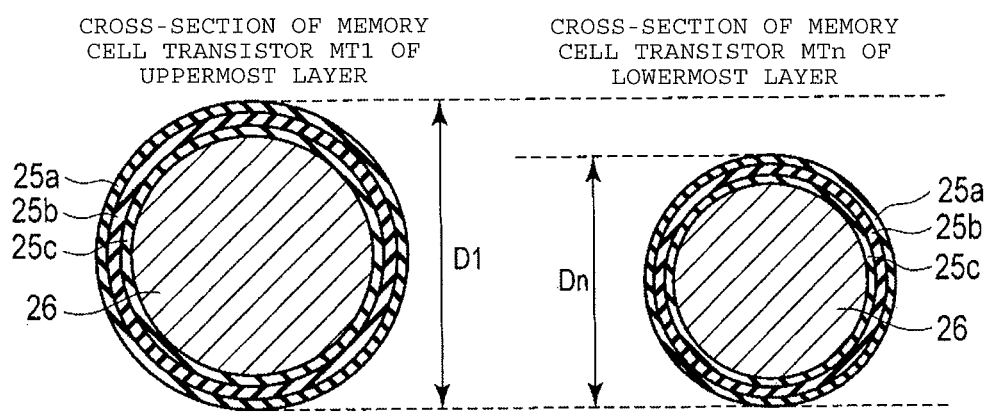
FIG. 7 is a cross-sectional diagram of a memory cell transistor according to the first embodiment.

In addition, the size of the memory cell transistor MT depends on the diameter D of the memory hole 24. The size of the memory cell transistor MT described in the present disclosure may be, for example, the surface area of the memory hole 24 which is determined by the thickness of the word line WL and the circumference of the memory hole 24 which is formed in the word line WL, the volume of the charge storage layer 25b which is determined by the thickness of the word line WL and the thickness and the circumference of the charge storage layer 25b of the memory cell transistor MT, the volume of the semiconductor layer 26 which is determined by the thickness of the word line WL and the diameter of the semiconductor layer 26 of the memory cell transistor MT, or the like. In any case, as long as the thickness of the word line WL is the same as that of each of the layers, the size of the memory cell transistor MT is determined by the diameter D of the memory hole 24 (=the circumference of the memory hole). FIG. 7 is a cross-sectional diagram of the memory cell transistors MT1 and MTn. As illustrated in the diagram, since D1>Dn, the sizes TS1 and TSn of the memory cell transistors MT1 and MTn also have a relationship where TS1>TSn. In other words, the smaller the diameter D of the memory hole 24 is, the smaller the size of the memory cell transistor MT is.

1.1.3 Row Decoders 11

Figure 8:
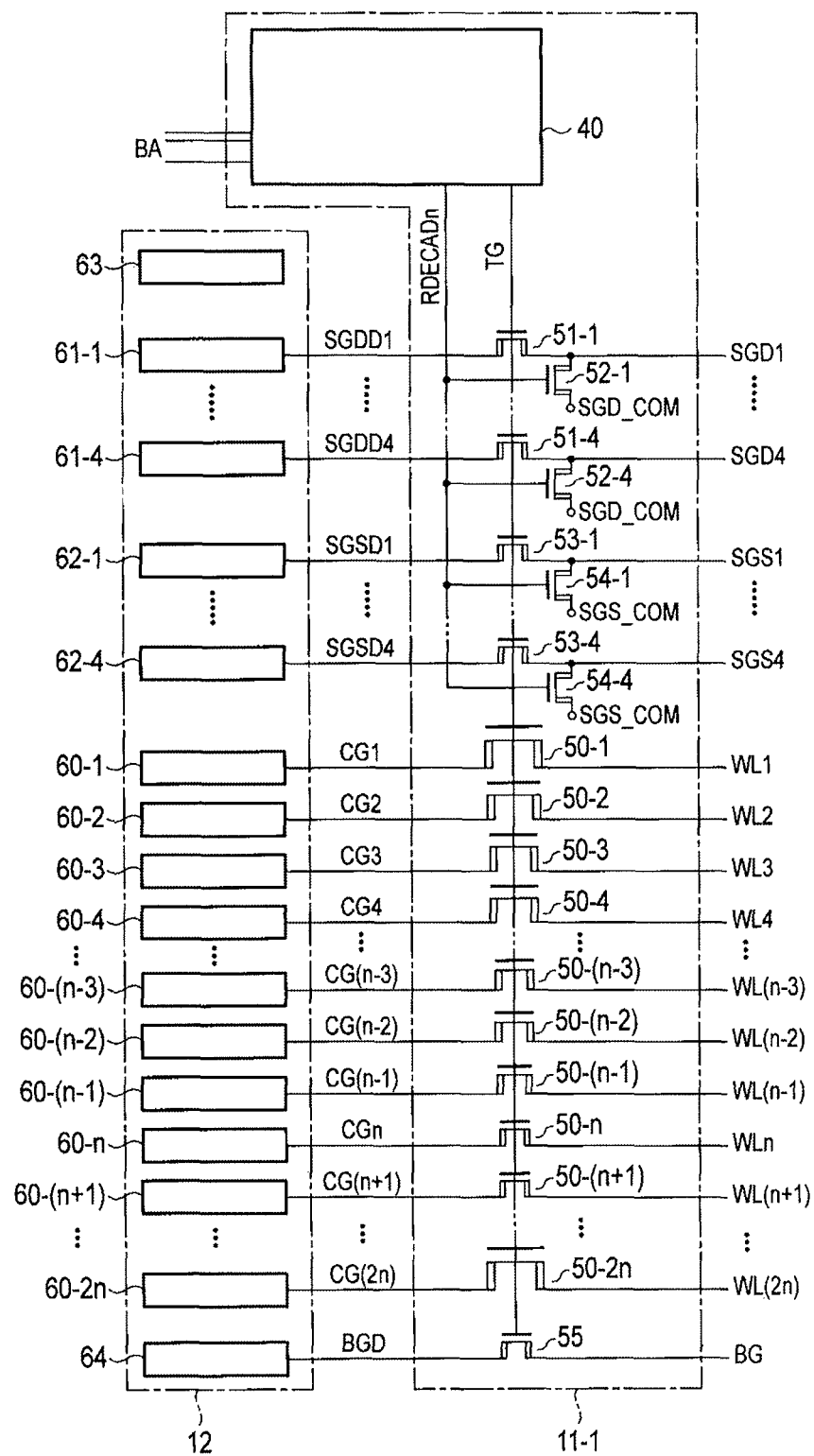
FIG. 8 is a block diagram of a row decoder and a driver circuit according to the first embodiment.

Next, description will be given of the configuration of the row decoders 11. The row decoders 11-1 to 11-4 are respectively provided to be associated with the blocks BLK1 to BLK4 and are provided in order to set the blocks BLK1 to BLK4 to be selected or not selected. FIG. 8 illustrates the configuration of the row decoder 11-1 and the driver circuit 12. Here, the configurations of the row decoders 11-2 to 11-4 are also the same as that of the row decoder 11-1.

As illustrated in the diagram, the row decoder 11-1 is provided with a block decoder 40 and high-breakdown voltage n channel MOS transistors 50 (50-1 to 50-2n), 51 (51-1 to 51-4), 52 (52-1 to 52-4), 53 (53-1 to 53-4), 54 (54-1 to 54-4), and 55.

1.1.3.1 Block Decoder 40

Firstly, description will be given of the block decoder 40. The block decoder 40 decodes a block address BA. Then, according to the result, a logic level of a signal line TG and a signal line RDECADn is determined and the on/off states of the transistors 50 to 55 are controlled.

When data is written, read, and erased, if the block address matches the block BLK1, the block decoder 40 applies an "H" level to the signal line TG and applies an "L" level (for example, 0 V) to the signal line RDECADn. On the other hand, when the block address does not match the block BLK1, the block decoder 40 applies an "L" level (for example, 0 V) to the signal line TG and applies an "H" level to the signal line RDECADn.

1.1.3.2 Transistors 50

Next, description will be given of the transistors 50. The transistors 50 are for transferring a voltage to the word line WL of the selection block BLK. One end of the current paths of the transistors 50-1 to 50-2n is connected with each of the word lines WL1 to WL(2n) of the corresponding block BLK1, the other ends are connected with each of signal lines CG1 to CG(2n), and the gates are connected in common with the signal line TG.

Accordingly, for example, the transistors 50-1 to 50-2n are in the on state and the word lines WL1 to WL(2n) are connected with the signal lines CG1 to CG(2n) in the row decoder 11-1 which corresponds to the selection block BLK1. On the other hand, the transistors 50-1 to 50-2n are in the off state and the word lines WL1 to WL(2n) are separated from the signal lines CG1 to CG(2n) in the row decoders 11-2 to 11-4 which correspond to the non-selection block BLK2 to BLK4.

Figure 9:
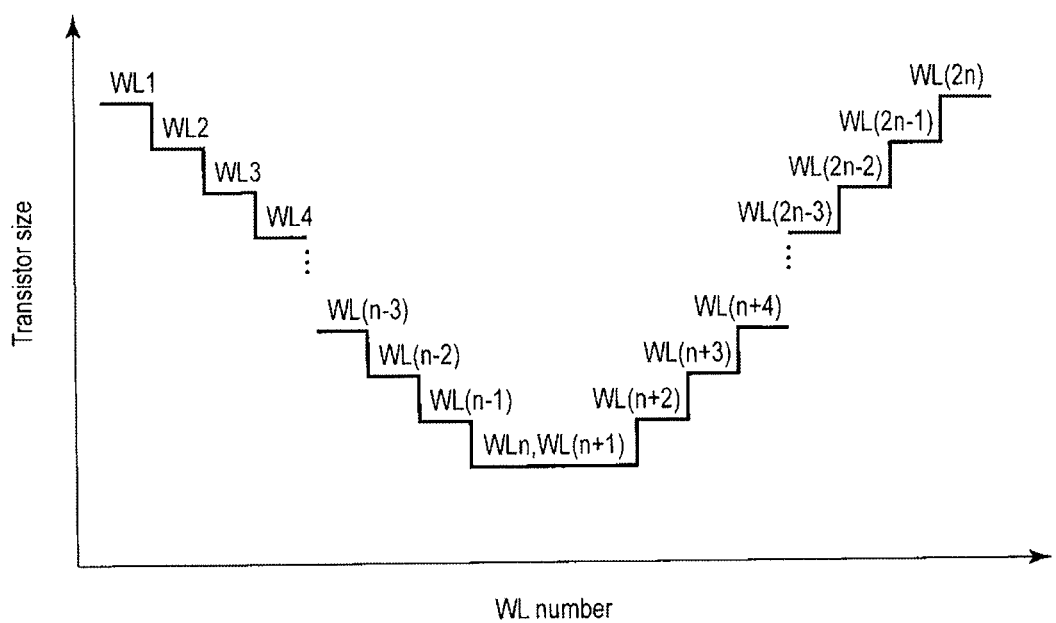
FIG. 9 is a graph which illustrates a relationship between the word lines and the sizes of transistors which correspond thereto according to the first embodiment.

In addition, as illustrated in FIG. 8, the transistors 50-1 to 50-2n each have different transistor sizes. The transistor size described in the present disclosure is, for example, an area which is determined by the product (L×W) of the gate length L and the gate width W which determine the gate size of the transistor. Then, either or both of the gate lengths L and gate widths W of the transistors 50-1 to 50-2n are different from each other. FIG. 9 is a graph which illustrates a relationship between the word lines WL and the transistor sizes of the transistors 50 which correspond to each of the word lines WL. As illustrated in the diagram, when focusing on the transistors 50-1 to 50-n which correspond to the word lines WL1 to WLn, the transistor sizes TS1 to TSn have a relationship where TS1>TS2> . . . >TSn. In addition, when focusing on the transistors 50-(n+1) to 50-2n which correspond to the word lines WL(n+1) to WL(2n), the transistor sizes TS(n+1) to TS(2n) have a relationship where TS(2n)>TS(2n−1)> . . . >TS(n+1).

That is, the transistor sizes of the transistors 50 are increased corresponding to the word line WL where the diameter D of the formed memory hole 24 is increased. In other words, the current driving force (the voltage transferring capacity) is higher.

1.1.3.3 Transistors 51 and 52

Next, returning to FIG. 8, description will be given of the transistors 51 and 52. The transistors 51-1 to 51-4 and 52-1 to 52-4 are for transferring a voltage to the selection gate lines SGD. One end of each of the current paths of the transistors 51-1 to 51-4 is connected with the selection gate lines SGD1 to SGD4 of the corresponding BLK1, the other ends are connected with signal lines SGDD1 to SGDD4, and the gates are connected in common with the signal line TG. In addition, one end of each of the current paths of the transistors 52-1 to 52-4 is connected with the selection gate lines SGD1 to SGD4, the other ends are connected with a node SGD_COM, and the gates are connected in common with the signal line RDECADn. The node SGD_COM is a voltage which sets the select transistor ST1 to an off state, for example, 0 V or the like.

Accordingly, for example, the transistors 51-1 to 51-4 are in the on state and the transistors 52-1 to 52-4 are in the off state in the row decoder 11-1 which corresponds to the selection block BLK1. Thus, the selection gate lines SGD1 to SGD4 of the selection block BLK1 are connected with the signal lines SGDD1 to SGDD4.

On the other hand, the transistors 51-1 to 51-4 are in the off state and the transistors 52-1 to 52-4 are in the on state in the row decoders 11-2 to 11-4 which correspond to the non-selection blocks BLK2 to BLK4. Thus, the selection gate lines SGD1 to SGD4 of the non-selection blocks BLK2 to BLK4 are connected with the node SGD_COM.

1.1.3.4 Transistors 53 and 54

The transistors 53 and 54 are for transferring a voltage to the selection gate lines SGS and the connection and operation thereof are equivalent to the connection and operation where the selection gate lines SGD are replaced with the selection gate lines SGS in the transistors 51 and 52.

That is, the transistors 53-1 to 53-4 are in the on state and the transistors 54-1 to 54-4 are in the off state in the row decoder 11-1 which corresponds to the selection block BLK1. On the other hand, the transistors 53-1 to 53-4 are in the off state and the transistors 54-1 to 54-4 are in the on state in the row decoders 11-2 to 11-4 which correspond to the non-selection blocks BLK2 to BLK4.

1.1.3.5 Transistor 55

Next, description will be given of the transistor 55. The transistor 55 is for transferring a voltage to the back gate lines BG. One end of the current path of the transistor 55 is connected with the back gate line BG1 of the corresponding block BLK1, the other end is connected with the signal line BGD, and the gate is connected in common with the signal line TG.

Accordingly, the transistor 55 is in the on state in the row decoder 11-1 which corresponds to the selection block BLK1 and the transistor 55 is in the off state in the row decoders 11-2 to 11-4 which correspond to the non-selection blocks BLK2 to BLK4.

1.1.4 Driver Circuit 12

Hereinafter, description will be given of the configuration of the driver circuit 12 illustrated in FIG. 8. The driver circuit 12 transfers a necessary voltage for writing data to, reading data from, and erasing data from each of the signal lines CG1 to CG(2n), SGDD1 to SGDD4, SGSD1 to SGSD4, and BGD.

The driver circuit 12 is provided with WL drivers 60 (60-1 to 60-2n), SGD drivers 61 (61-1 to 61-4), SGS drivers 62 (62-1 to 62-4), a BG driver 64, and a voltage driver 63.

1.1.4.1 Voltage Driver 63

Firstly, description will be given of the voltage driver 63. The voltage driver 63 transfers a voltage which is used in the block decoder 40 and the WL drivers 60. The voltage which is transferred is generated in the voltage generating circuit 14.

The voltage which is transferred by the voltage driver 63 at the time of data writing (programming) is, for example, VPGM, VPGMH, VPASS, or VISO. The VPGM is a high voltage which is transferred to the selection word line WL. The VPGMH is a higher voltage than the VPGM and is applied to each of the gates when the transistors 50, 51, 53, and 55 of the row decoder are set to an on state via the block decoder 40. The VPASS is a voltage which is transferred to the non-selection word line WL and a voltage which sets the memory cell transistor MT to an on state regardless of the held data. The VISO is a voltage which is transferred to the non-selection word line WL and a voltage which sets the memory cell transistor MT to an off state regardless of the held data.

The voltage which is transferred by the voltage driver 63 at the time of data reading is VREAD, VREADH, or VCGRV. The VREAD is a voltage which is transferred to the non-selection word line WL and a voltage which sets the memory cell transistor MT to an on state regardless of the held data. The VREADH is a higher voltage than the VREAD and is applied to each of the gates when the transistors 50, 51, 53, and 55 of the row decoder are set to an on state via the block decoder 40. The VCGRV is a high voltage which is transferred to the selection word line WL.

1.1.4.2 WL Driver 60

Next, description will be given of the WL driver 60. The WL drivers 60-1 to 60-2n respectively transfer a necessary voltage to the signal lines CG1 to CG(2n) (word lines WL1 to WL(2n)).

The voltage VPGM is transferred to the corresponding signal line CG at the time of programming in the WL driver 60 which corresponds to the selection word line WL. In addition, at the time of reading, the voltage VCGRV is transferred to the corresponding signal line CG. Then, the voltages are transferred to the selection word line WL via the current path of the transistor 50.

In addition, the voltage VPASS or the voltage VISO is selected and transferred to the corresponding signal line CG at the time of programming in the WL driver 60 which corresponds to the non-selection word line WL. In addition, at the time of reading, the voltage VREAD is transferred to the corresponding signal line CG. Then, the voltages are transferred to the non-selection word lines WL via the current path of the transistor 50.

Here, the CG1 to CG(2n) may be in common among each of the blocks BLK. That is, the four word lines WL1 which belong to the four blocks BLK1 to BLK4 respectively may be driven in the same WL driver 60-1 via the transistor 50-1 of the corresponding row decoders 11-1 to 11-4. The same also applies to the other signal lines CG1 to CG(2n).

1.1.4.3 SGD Drivers 61

Next, description will be given of the SGD drivers 61. The SGD drivers 61-1 to 61-4 each transfer a necessary voltage to the signal lines SGDD1 to SGDD4 (selection gate lines SGD1 to SGD4).

The voltage VSGD is transferred to the corresponding signal line SGDD in the SGD driver 61 which corresponds to the selection gate line SGD which is connected with the NAND string 16 which includes the selection word line WL. The voltage VSGD is a voltage which sets the select transistor ST1 to an on state at the time of reading (at the time of writing, the select transistor ST1 is set to an on state according to the writing data). On the other hand, for example, 0 V is transferred to the signal line SGDD in the other SGD drivers 61.

1.1.4.4 SGS Drivers 62

Next, description will be given of the SGS drivers 62. The SGS drivers 62-1 to 62-4 each transfer a necessary voltage to the signal lines SGSD1 to SGSD4 (the selection gate lines SGS1 to SGS4). At the time of reading, the voltage VSGS is transferred to the corresponding signal line SGSD in the SGS driver 62 which corresponds to the selection gate line SGS which is connected with the NAND string 16 which includes the selection word line WL. The voltage VSGS is a voltage which sets the select transistor ST2 to an on state.

On the other hand, for example, 0 V is transferred to the signal line SGSD in the other SGS drivers 62. The same also applies to the writing.

1.1.4.5 BG Driver 64

Next, description will be given of the BG driver 64. The BG driver 64 transfers the voltage VPASS (or VISO) to the back gate lines BG at the time of writing and transfers the voltage VREAD to the back gate lines BG at the time of reading.

1.2 Write Operation of Data

Next, description will be given of the write operation of the NAND type flash memory with the configuration described above, focusing on the operation of the transistor 50 and the WL driver 60.

1.2.1 Overall Flow of Write Operation of Data

Figure 10:
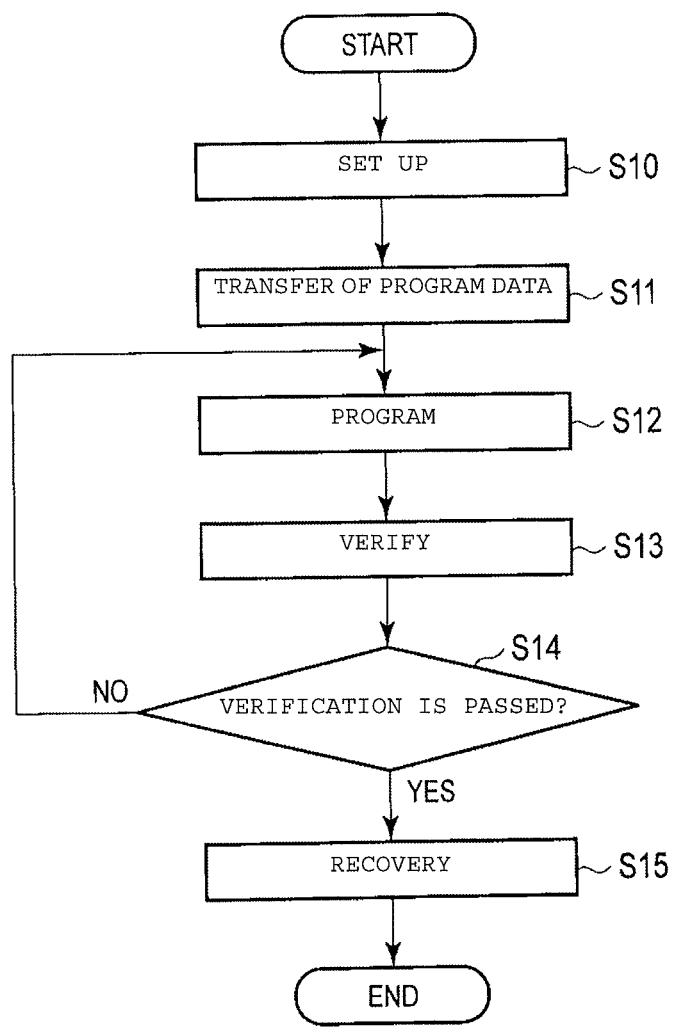
FIG. 10 is a flowchart of a data writing method according to the first embodiment.

Firstly, simple description will be given of the flow of the write operation of data using FIG. 10. FIG. 10 is a flow chart which illustrates a flow of a write operation.

The writing of data is performed collectively with regard to all of the memory cell transistors MT (one page) which are connected with the same word line WL in any of the string units SU. In the present disclosure, the operation of inputting a charge into the charge storage layer by applying a potential difference between the control gate and the channel and of increasing the threshold of the memory cell transistor MT by this is referred to as "programming". By executing the programming a plurality of times, the threshold of the memory cell transistor MT is increased to a desired value and the write operation of data is performed.

Firstly, when the control circuit 15 receives a writing command, setting up is performed (step S10). That is, an instruction to set up a circuit is given with regard to the voltage generating circuit 14. Responding to this, the voltage generating circuit 14 generates the VPGMH, VPGM, and VPASS (and VISO).

Next, the writing data is transferred to the sense amplifier 13 and the writing data is further transferred from the sense amplifier 13 to each of the bit lines BL (step S11). In other words, the sense amplifier 13 applies the voltage according to the writing data to each of the bit lines BL.

Next, the programming is performed (step S12). The details of the programming operation will be described using a case where the word line WL3 of the string unit SU1 of the block BLK1 illustrated in FIG. 4 is set as an example.

Firstly, in the row decoder 11-1, the block decoder 40 outputs an "H" level (VPGMH) to the signal line TG. As a result, the transistors 50-1 to 50-2n are in the on state. In this state, the WL driver 60-3 which corresponds to the selection word line WL3 transfers the VPGM to the transistor 50-3 via the signal line CG3. The transistor 50-3 carries out the transfer to the word line WL3 by controlling the value of the VPGM according to the transistor size. In addition, the VPASS (or VISO) is transferred from each of the WL drivers 60-1, 60-2, and 60-4 to 60-2n to the non-selection word lines WL1, WL2, and WL4 to WL(2n) via the signal lines CG1, CG2, and CG4 to CG(2n) and the transistors 50-1, 50-2, and 50-4 to 50-2n.

In addition, the select transistor ST1 is in the on or off state according to the writing data. If the select transistor ST1 is in the on state, the writing data which is transferred to the bit lines BL is transferred to the memory cell transistor MT3 which is connected to the selection word line WL3 and the data is programmed in the memory cell transistor MT3.

Next, verification is performed (step S13). The verification is a process which determines whether desired data is written or not by reading the data from the memory cell transistor MT after the programming. Then, if the desired data has not been yet written, the programming of step S12 is repeated. Below, the state where it is determined that the threshold voltage of the memory cell transistor MT is sufficiently increased and that the desired data is written is referred to as "verification passed" and the state where it is determined that the increase in the threshold voltage is not sufficient and that the writing of the data has not been yet completed is referred to as "verification failed".

When the verification is failed, the programming is performed again by returning to step S12. Then, when all of the selection cells pass the verification by repeating the programming described above (step S14, YES), a recovery is performed (step S15), and the writing of data is finished.

1.2.2 Program Voltage

Figure 11:
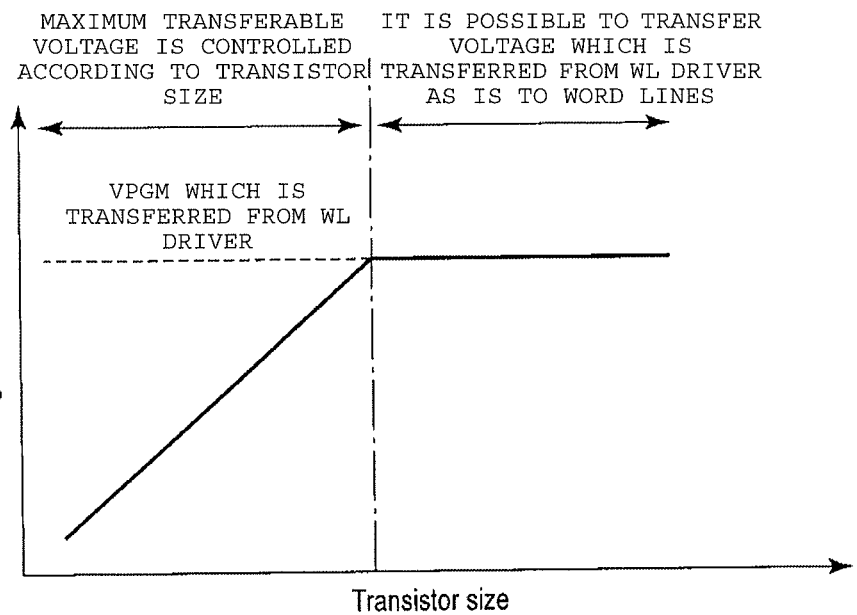
FIG. 11 is a graph which illustrates a relationship of a maximum transferable voltage with respect to the size of the transistor according to the first embodiment.

Detailed description will be given of the program voltage VPGM which is transferred to the selection word line WL in step S12 described above. FIG. 11 is a graph which illustrates a relationship of the maximum transferable voltage with regard to the size of the transistor 50.

As illustrated in the diagram, since the transistor 50 with a sufficiently large size has a high voltage transferring capacity, it is possible to transfer the program voltage VPGM which is transferred from the WL driver 60 to the corresponding word line WL as is. In contrast to this, since the transistor 50 with a small size has a low voltage transferring capacity, the maximum transferable voltage is limited according to the transistor size. In other words, the transistor 50 regulates and transfers the program voltage VPGM, which is transferred from the WL driver 60, to the corresponding word line WL. In other words, the program voltage VPGM which is transferred to the word line WL is controlled according to the size of the transistor 50. For example, since the sizes TS1 to TSn of the transistors 50 which are examples in FIG. 9 have a relationship where TS1>TS2> . . . >TSn, the maximum value of the program voltages VPGM1 to VPGMn which it is possible to transfer to the word lines WL1 to WLn has a relationship where VPGM1>VPGM2> . . . >VPGMn.

Figure 12:
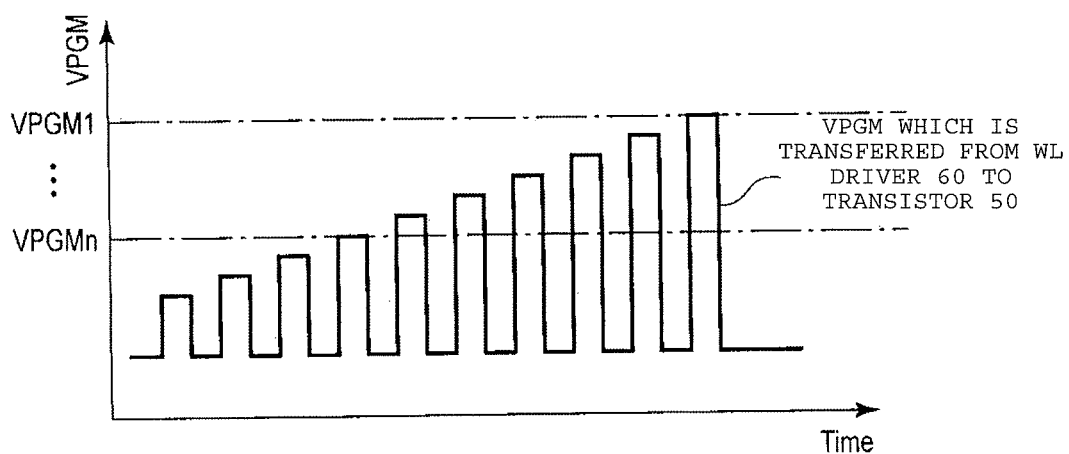
FIG. 12 is a timing chart of a program voltage which is transferred from a WL driver to the transistor according to the first embodiment.
Figure 13:
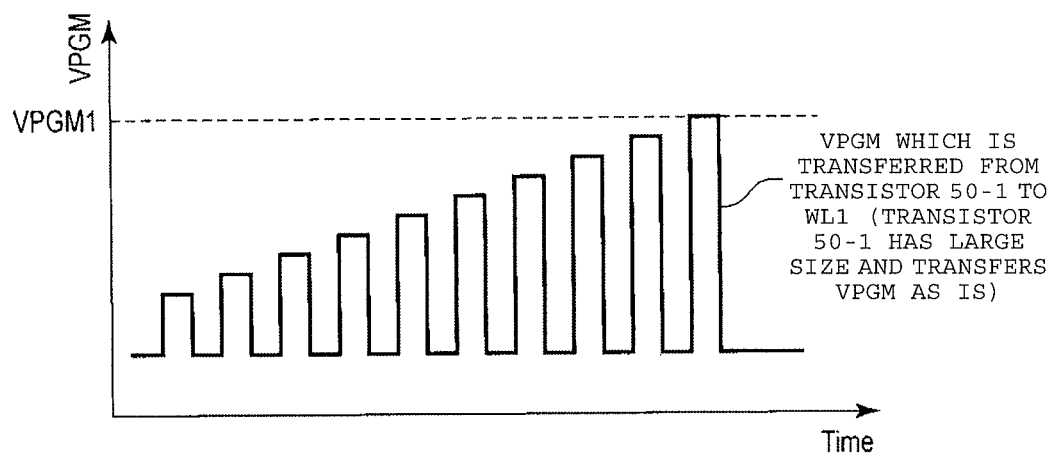
FIG. 13 is a timing chart of a program voltage which is transferred to a word line according to the first embodiment.
Figure 14:
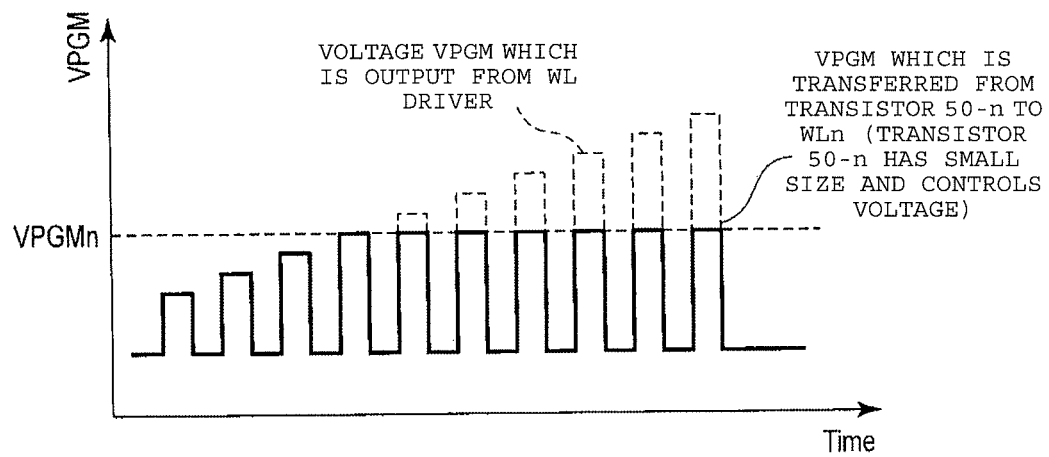
FIG. 14 is a timing chart of a program voltage which is transferred to a word line according to the first embodiment.

FIG. 12 is a graph which illustrates a relationship between a program frequency and the program voltage VPGM which is transferred from the WL driver 60 to the transistor 50. FIG. 13 is a graph which illustrates a relationship between the program frequency and the program voltage VPGM which is transferred from the transistor 50-1 to the word line WL1 and FIG. 14 is a graph which illustrates a relationship between the program frequency and the program voltage VPGM which is transferred from the transistor 50-*n* to the word line WL*n*. For example, as illustrated in FIG. 12, the WL driver 60 steps up the program voltage VPGM which is transferred each time the verification is failed.

Then, since the size of the transistor 50-1 is large as illustrated in FIG. 13, the program voltage VPGM which is transferred from the WL driver 60-1 is transferred to the word line WL1 as is. In contrast to this, the size of the voltage which is transferred to the word line WL is saturated at the VPGM*n* in the transistor 50-*n* with a small size. That is, as illustrated in FIG. 14, at a certain time, the transistor 50-*n* starts to transfer a certain value VPGM*n* to the word line WL without stepping up the program voltage. In other words, the voltage which is supplied is controlled by the transistor 50-*n* and the voltage which is obtained as a result is transferred to the word line WL.

1.3 Effect According to Present Embodiment

As described above, the sizes of the memory cell transistors MT in the three-dimensional stacked type memory cell array are different according to the layer where the corresponding word line WL is formed. As a result, the characteristics of the memory cell transistors MT are different according to the layer.

Figure 15:
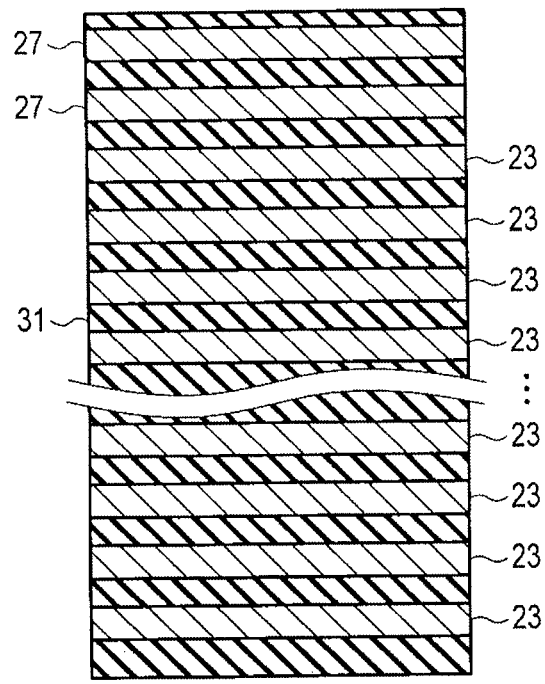
FIG. 15 is a cross-sectional diagram which illustrates a manufacturing process of a NAND string according to the first embodiment.
Figure 16:
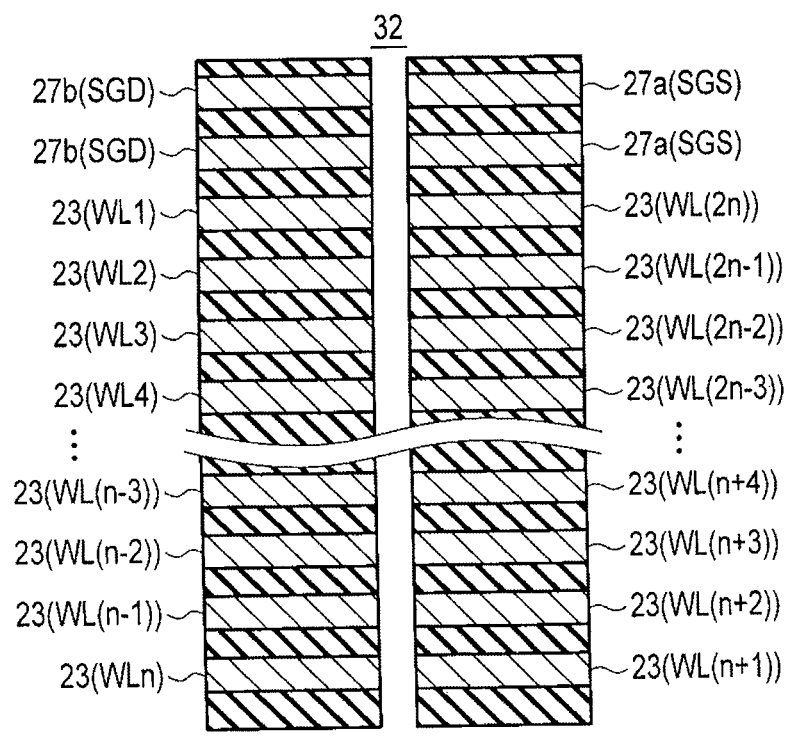
FIG. 16 is a cross-sectional diagram which illustrates a manufacturing process of a NAND string according to the first embodiment.
Figure 17:
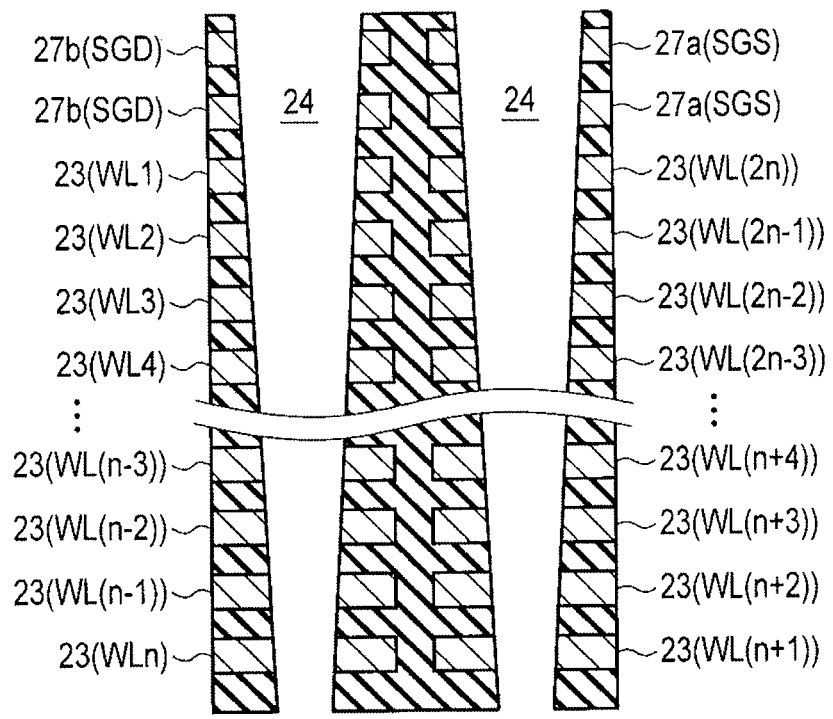
FIG. 17 is a cross-sectional diagram which illustrates a manufacturing process of a NAND string according to the first embodiment.

The cause of the sizes of the memory cell transistors MT being different according to the layer in this manner is the manufacturing method. The method of manufacturing the three-dimensional stacked type memory cell array will be described using FIG. 15 to FIG. 17. FIG. 15 to FIG. 17 are cross-sectional diagrams which show the manufacturing processes of the memory cell array in order.

Firstly, as illustrated in FIG. 15, a plurality of word line conductive layers 23 and a plurality of insulating films 31 are alternately stacked on a back gate transistor layer L1 which is not illustrated in the diagram and two conductive layers 27 are further stacked on the upper layer thereof. Here, the insulating film 31 is, for example, silicon oxide ($SiO_2$).

Next, as illustrated in FIG. 16, a plurality of the word line conductive layers 23 and conductive layers 27 are patterned. As a result, the word lines WL are formed by the conductive layer 23 and the selection gate lines SGD and SGS are formed by the conductive layer 27. Then, a slit 32 which is generated in the patterning process is filled in with the insulating film.

Next, as illustrated in FIG. 17, the memory hole 24 is formed using a photolithography technique and an etching technique. The memory hole 24 reaches a back gate transistor which is not illustrated in the diagram by passing through the selection gate lines SGD and SGS, a plurality of the word lines WL, and the insulating film 31.

After that, the insulating layers 25a to 25c and the semiconductor layer 26 are formed inside the memory hole 24 as illustrated in FIG. 4 and then, the source line SL, the plug layer 29, and the bit lines BL are formed in order.

With the present method, as described in FIG. 17, the memory hole 24 is formed by etching a plurality of the word line layers in a batch. In particular, it is possible to improve the degree of integration by increasing the number of the memory cell transistors MT layers in the three-dimensional stacked type memory. Then, as the number of the memory cell transistors MT layers is increased, the memory hole 24 is further deepened. As a result, there are cases where the aspect ratio (=[memory hole height]/[memory hole opening diameter]) which represents the ratio of the opening diameter and the height of the memory hole 24 is 20 or more. When the aspect ratio is large, it is hard to form the memory hole 24 with an orthogonal shape. That is, as illustrated in FIG. 17, the memory hole 24 has a taper shape. Then, as a result of the memory hole 24 having a taper shape, the size of the memory cell transistor MT on the lower layer is smaller and the size of the memory cell transistor MT on the upper layer is larger. Then, by the difference in the sizes, the characteristics of the memory cell transistor MT are different according to the layer. More specifically, as the size of the memory cell transistor MT becomes larger, it is harder to program data and a higher program voltage VPGM is necessary. On the other hand, as the size of the memory cell transistor MT becomes smaller, it is easier to program data and it is possible to write data with a lower program voltage VPGM.

In this point, with the configuration according to the present embodiment, the size of the transfer transistor 50 changes according to the size of the memory hole 24. More specifically, since the memory hole 24 is large, the size of the transistor 50, which transfers a voltage to the memory cell transistor MT on the upper layer of which the size is large, is large. That is, the current driving force is large and it is possible to transfer a higher voltage. On the other hand, since the memory hole 24 is small, the size of the transistor 50, which transfers a voltage to the memory cell transistor MT on the lower layer of which the size is small, is small. That is, the current driving force is small and a low voltage where the voltage VPGM is regulated is transferred.

As a result, the transistor 50 which corresponds to the memory cell transistor MT which is positioned on the upper layer and where it is hard to program data has a high current driving force and transfers a higher voltage to the word lines WL. On the other hand, the transistor 50 which corresponds to the memory cell transistor MT which is positioned on the lower layer and where it is easy to program data has a low current driving force and transfers a lower voltage to the word lines WL by regulating the voltage VPGM which is supplied from the WL driver 60.

In this manner, the size of the transfer transistor 50 is optimized to match the size of the memory cell transistor MT. Accordingly, it is not necessary to enlarge the size of the transistor 50 unnecessarily and it is possible to miniaturize the NAND type flash memory 1.

In addition, as described above, it is possible for the memory cell transistors MT to increase the memory capacity while suppressing an increase in the area by stacking a plurality thereof in the direction which is orthogonal to the semiconductor substrate. In contrast to this, the peripheral circuit 20, such as the row decoders 11, is two-dimensionally arranged on the semiconductor substrate as illustrated in FIG. 2.

Then, the size of the peripheral circuit 20 is also increased to the extent that the memory capacity is increased. Then, the size of the NAND type flash memory 1 is increased by the enlargement of the peripheral circuit 20 regardless of whether the increase in area is suppressed in the memory cell array 10.

However, with the present embodiment, the transistors 50 in the row decoders 11 are formed with the minimum necessary size. Accordingly, it is possible to suppress the enlargement of the row decoders 11 and to miniaturize the NAND type flash memory 1. At the same time, since it is possible to optimize (possible to reduce) the size of the transistors 50, it is also possible to optimize (possible to reduce) the parasitic capacity and the parasitic resistance thereof. Owing to this, quick operation of the row decoders 11 is possible.

2. Second Embodiment

Next, description will be given of a semiconductor memory device according to a second embodiment. The present embodiment relates to the layout of the transistors 50 in the first embodiment described above. Below, description will be given only of points that the second embodiment is different from the first embodiment.

2.1 First Layout Example

Figure 18:
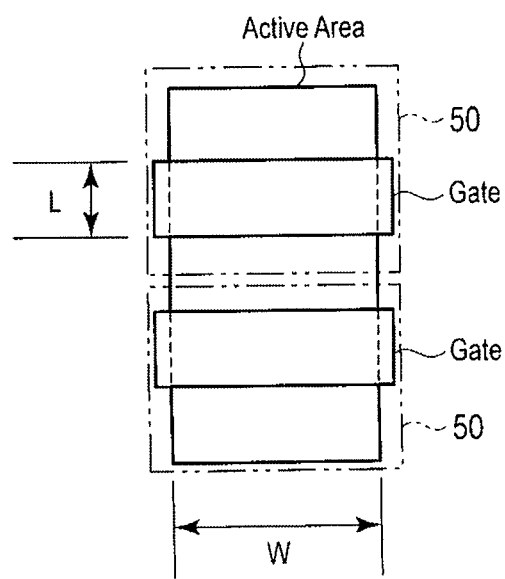
FIG. 18 is a planar diagram of the transistor according to a second embodiment.

Firstly, description will be given of a first example of the layout. In the present example, the gate width W of the transistor 50 is optimized. FIG. 18 is a planar diagram of the transistors 50. As illustrated in the diagram, for example, two transistors 50 are formed on individual active regions which are provided on the semiconductor substrate and these share a source or a drain. The two transistors 50 which are provided on the same active region correspond to the same word line WL as each other and correspond to different blocks BLK. That is, for example, the transistor 50-1 of row decoders 11-1 and 11-2 which respectively correspond to the BLK1 and BLK2 is formed on the same active region. Then, one of the shared source and drain is connected with the WL driver 60 and the other is connected with the word line WL of the corresponding block BLK.

Figure 19:
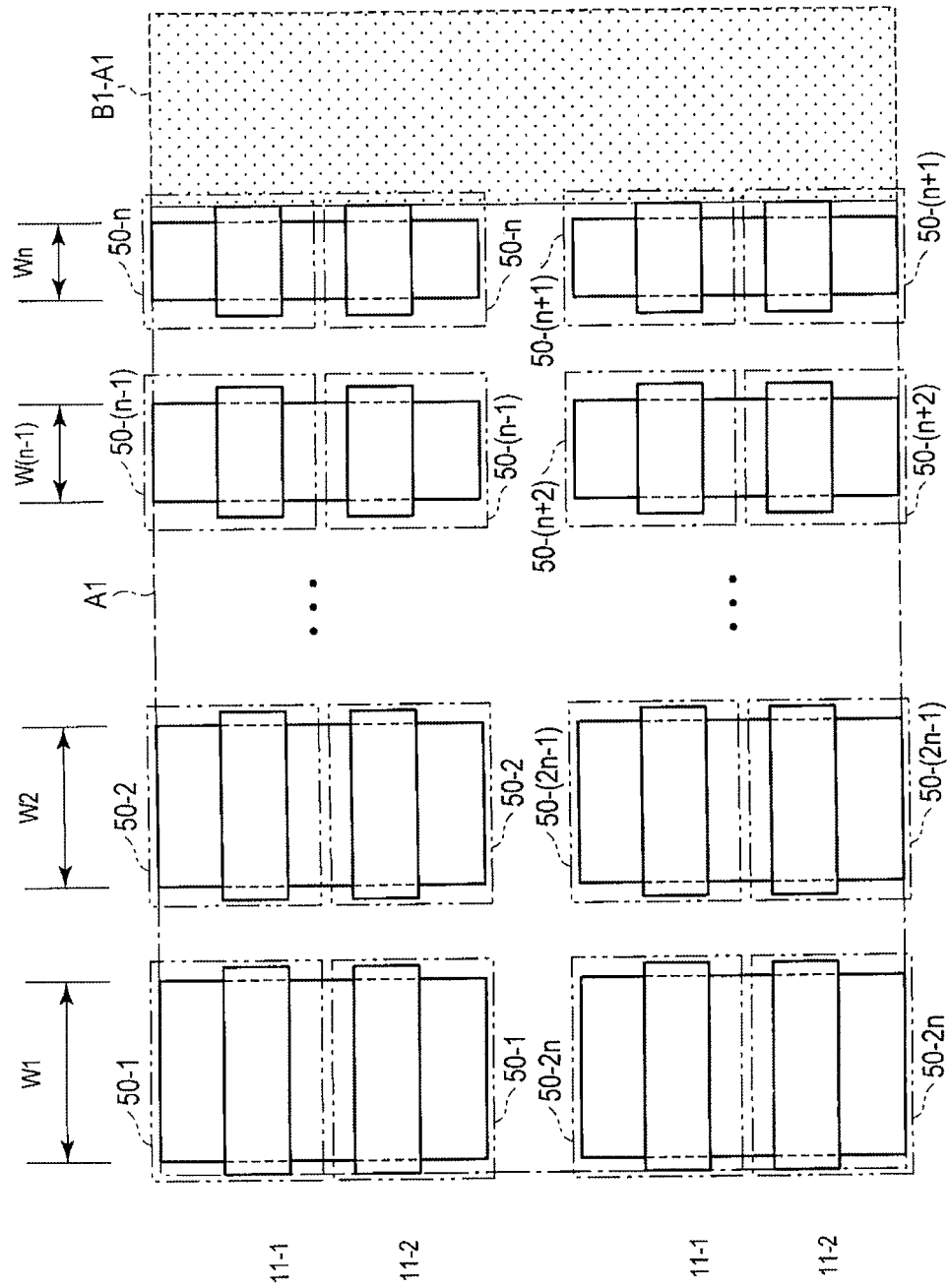
FIG. 19 is a layout diagram of the transistors according to a first example of the second embodiment.

Then, FIG. 19 is a planar diagram of the row decoders 11-1 and 11-2 according to the present example and in particular, illustrates the layout of the transistors 50. As illustrated in the diagram, the size of the transistor 50 is controlled by the gate width W thereof. In other words, if the size of the transistor 50 has the relationship illustrated in FIG. 9, the gate widths W1 to Wn of the transistors 50-1 to 50-$n$ have a relationship where W1>W2> . . . >Wn and the gate widths W(n+1) to W(2n) of the transistors 50-($n$+1) to 50-2n have a relationship where W(n+1)<W(n+2)< . . . <W(2n).

In addition, in the present example, the transistors 50 are arranged in order of the size of the transistors, the gate width W is larger as the transistors 50 are positioned on the left side of the diagram, and the gate width W is smaller as the transistors 50 are positioned on the right side. However, the relationship may be reversed.

Figure 20:
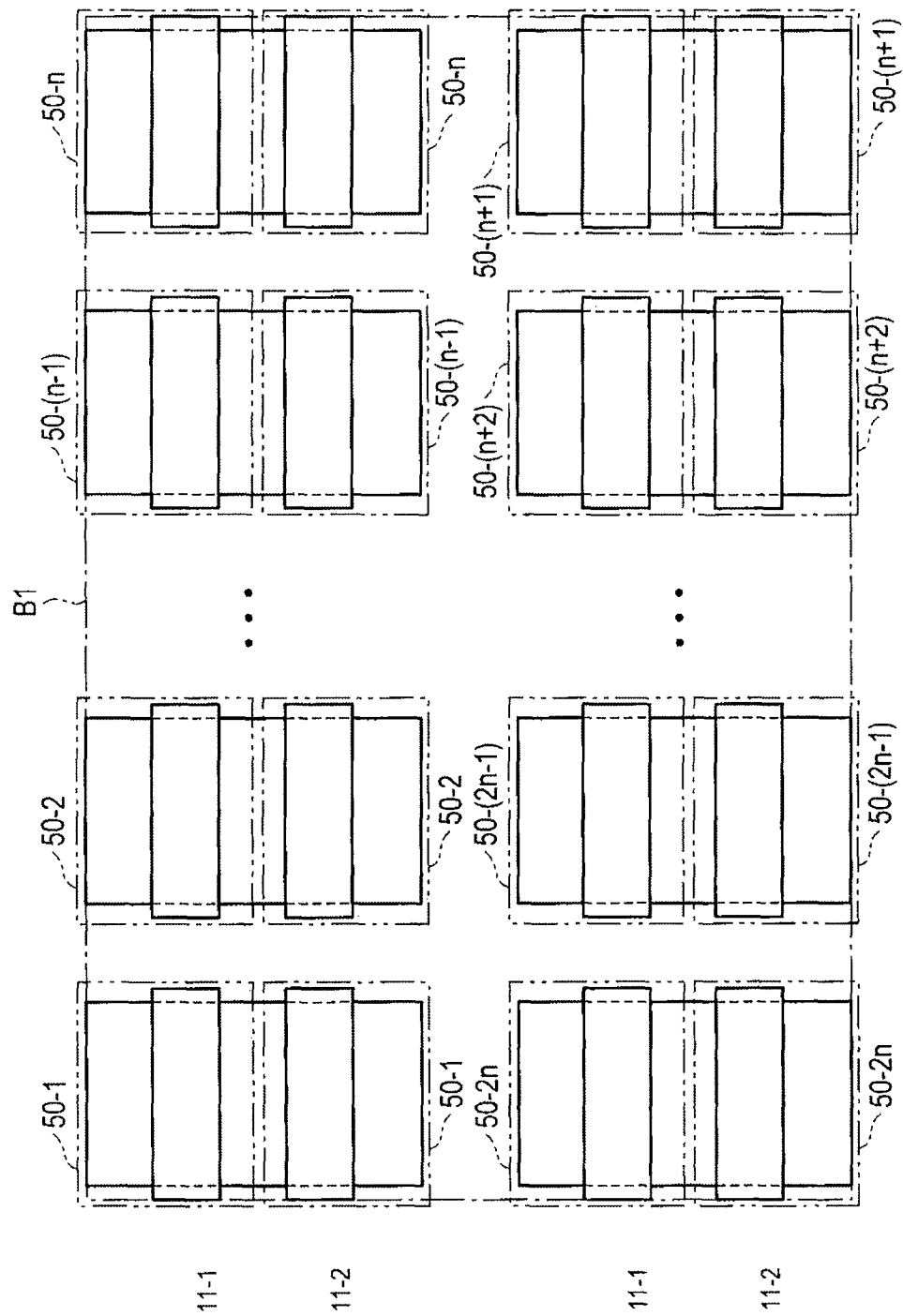
FIG. 20 is a layout diagram of the transistors of the same size.

Here, a layout diagram in a case where the transistor sizes are all the same is illustrated in FIG. 20 as a comparative example. When the area of the region where the transistors 50 are arranged in the layout in FIG. 19 according to the present example is A1 and the area of the region where the transistors 50 are arranged in FIG. 20 according to the comparative example is B1, there is a relationship where A1<B1. That is, according to the present example, it is possible to reduce the area by (B1−A1) by reducing the gate width W.

2.2 Second Layout Example

Next, description will be given of a second example of the layout. In the present example, the gate length L of the transistors 50 is optimized.

Figure 21:
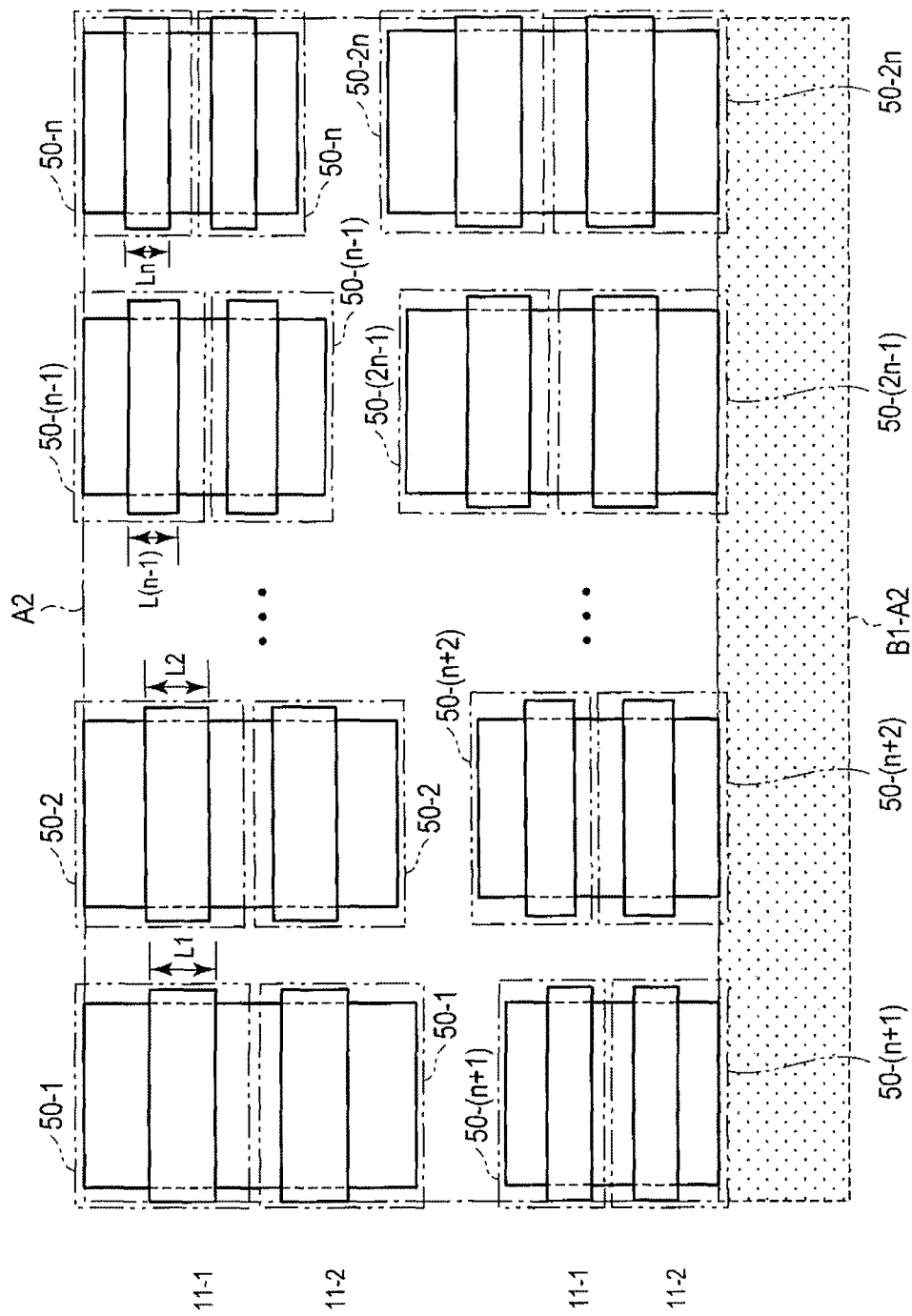
FIG. 21 is a layout diagram of the transistors according to a second example of the second embodiment.

FIG. 21 is a planar diagram of the row decoders 11-1 and 11-2 according to the present example and in particular, illustrates the layout of the transistors 50. As illustrated in the diagram, the size of the transistor 50 is controlled by the gate length L thereof. In other words, if the sizes of the transistor 50 have the relationship illustrated in FIG. 9, the gate lengths L1 to Ln of the transistors 50-1 to 50-$n$ have a relationship where L1>L2> . . . >Ln and the gate lengths L(n+1) to L(2n) of the transistors 50-($n$+1) to 50-2n have a relationship where L(n+1)<L(n+2)< . . . <L(2n).

In addition, in the present example, the transistors 50-1 to 50-$n$ are arranged such that the gate length L is larger as the transistors 50 are positioned on the left side of the diagram and the gate length L is smaller as the transistors 50 are positioned on the right side. In contrast to this, the transistors 50-($n$+1) to 50-2n are arranged such that the gate length L is smaller as the transistors 50 are positioned on the left side of the diagram and the gate length L is larger as the transistors 50 are positioned on the right side. However, the relationship may be reversed.

When the area of the region where the transistors 50 are arranged in the layout in FIG. 21 according to the present example is A2 and A2 is compared to the region B1 in FIG. 20, there is a relationship where A2<B1. That is, according to the present example, it is possible to reduce the area by (B1−A2) by shortening the gate length L.

2.3 Third Layout Example

Next, description will be given of a third example of the layout. In the present example, the first example and the second example described above are combined and both of the gate width W and the gate length L of the transistors 50 are optimized.

Figure 22:
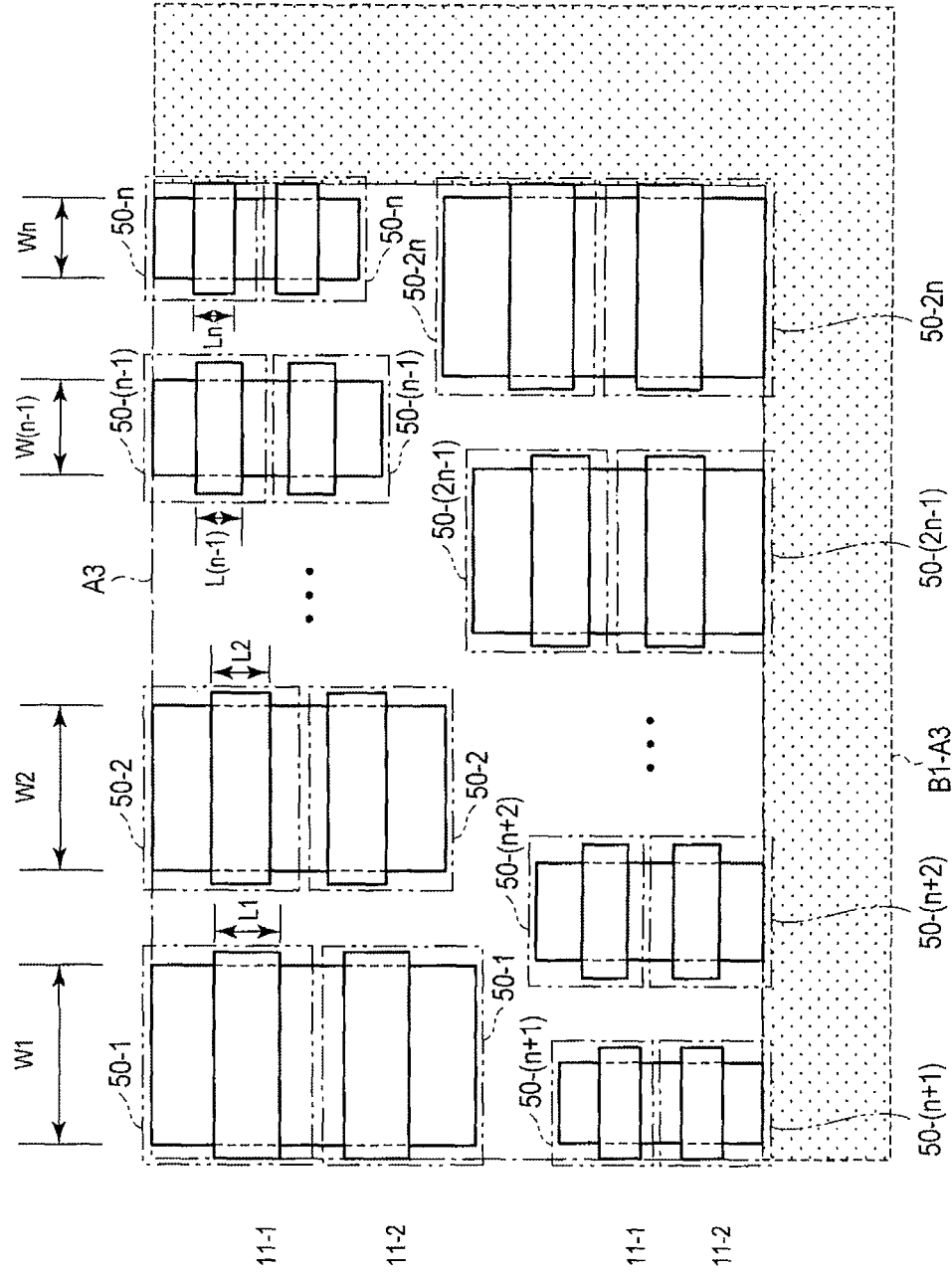
FIG. 22 is a layout diagram of the transistors according to a third example of the second embodiment.

FIG. 22 is a planar diagram of the row decoders 11-1 and 11-2 according to the present example and illustrates the layout of the transistors 50. According to the present example, the transistors 50-1 to 50-$n$ have a relationship where W1>W2> . . . >Wn and L1>L2> . . . >Ln and the transistors 50-($n$+1) to 50-2n have a relationship where W(2n)>W(2n−1)> . . . >W(n+1) and L(2n)>L(2n−1)> . . . >L(n+1). Then, the transistors 50-1 to 50-$n$ are arranged in order in a certain direction and the transistors 50-($n$+1) to 50-2n are arranged in order in the reverse direction. As a result, it is possible to reduce the size of the row decoders 11 in both the gate length direction and the gate width direction.

2.4 Effect According to Present Embodiment

As described above, it is possible to optimize the transistors 50 described in the first embodiment with the layout pattern described in the present embodiment. Owing to this, it is possible to reduce the area of the row decoders 11.

3. Third Embodiment

Next, description will be given of a semiconductor memory device according to a third embodiment. In the present embodiment, the size of the transistor 50 in the first and second embodiments described above is changed by a plurality of the word line units (referred to as a zone). Below, description will be given only of points that the third embodiment is different from the first and second embodiments.

3.1 Zone ZN Division of Memory Cell Array 10

Figure 23:
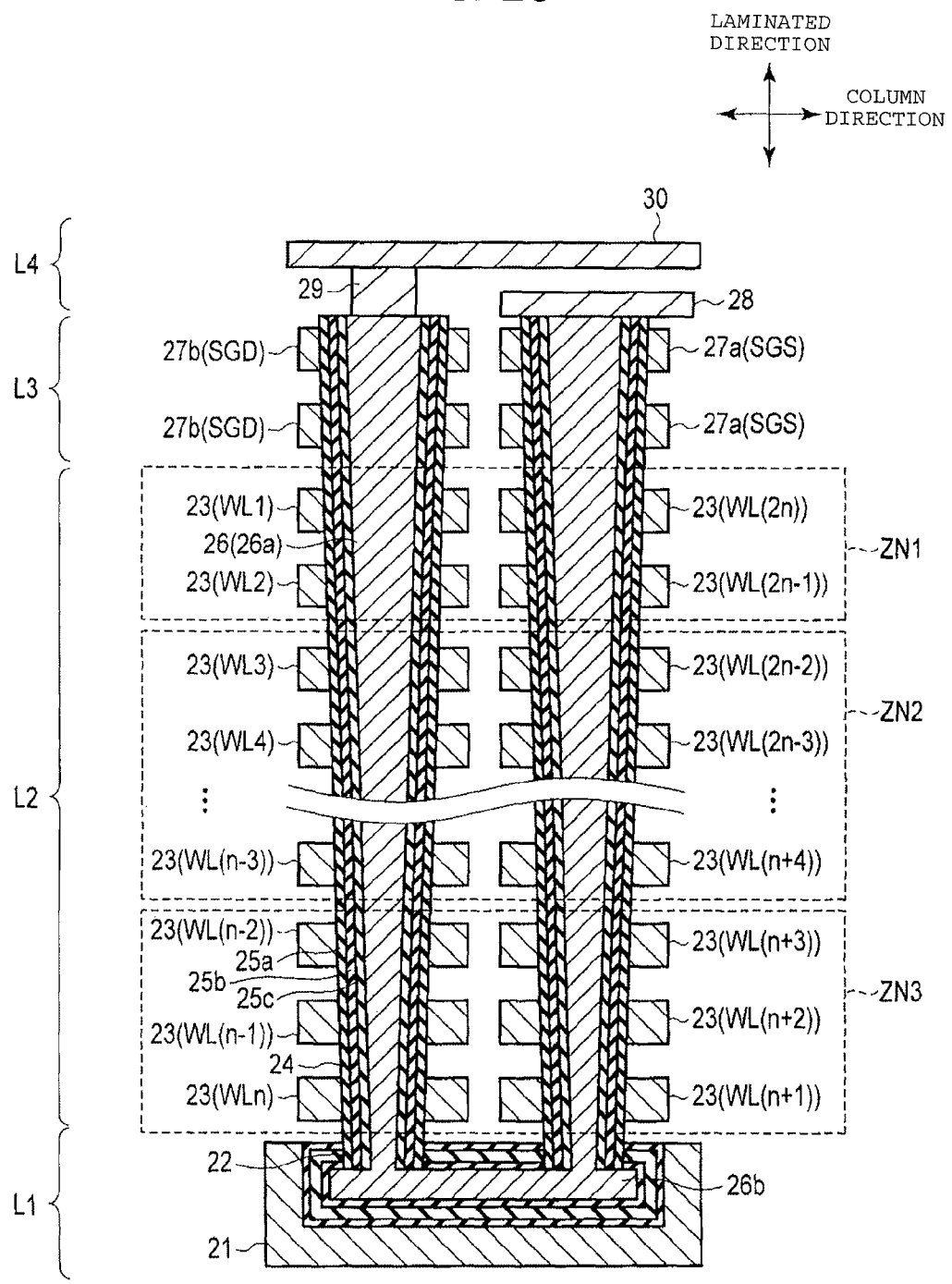
FIG. 23 is a cross-sectional diagram of a memory cell array according to a third embodiment.

FIG. 23 is a cross-sectional diagram of the NAND string 16 according to the present embodiment. As illustrated in the diagram, in the present embodiment, the word lines WL1 to WL(2n) are managed by being divided into, for example, three zones. The word lines WL1, WL2, WL(2n−1), and WL(2n) on the upper layer where the diameter D of the memory hole 24 is large belong to a zone ZN1, the word lines WL3 to WL($n$−3) and WL(n+4) to WL(2n−2) on the intermediate layer where the diameter D of the memory hole 24 is medium belong to a zone ZN2, and the word lines WL(n−2) to WL(n+3) on the lower layer where the diameter D of the memory hole 24 is small belong to a zone ZN3.

3.2 Zone ZN Division of Transistors 50

Figure 24:
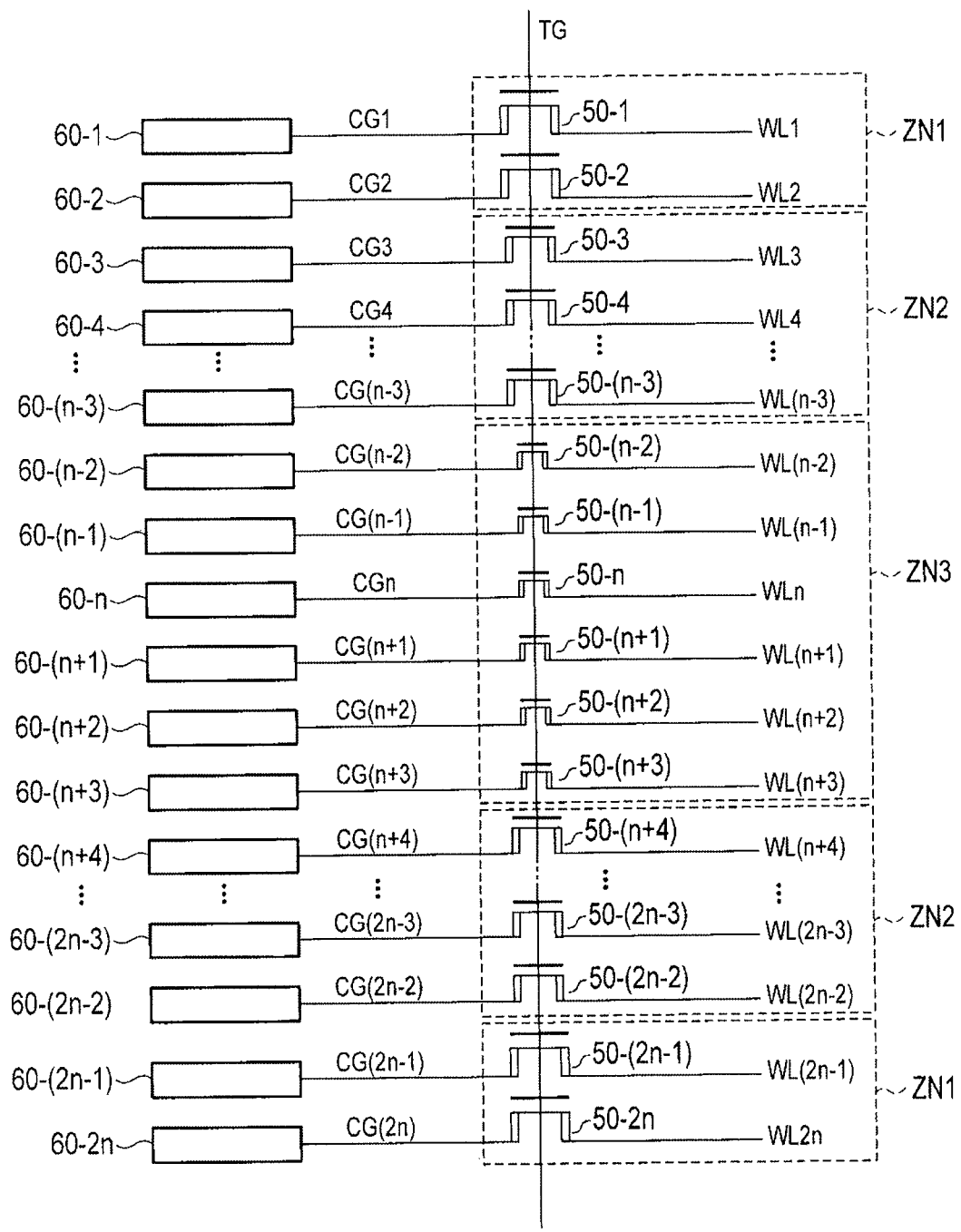
FIG. 24 is a block diagram of the transistors and WL drivers according to the third embodiment.

FIG. 24 is a diagram where the transistors 50 and the WL drivers 60 are extracted in the row decoders 11 and the driver circuit 12 according to the present embodiment. The transistors 50 belong to the same zone as the corresponding word lines WL. That is, the transistors 50-1, 50-2, 50-(2n−1), and 50-2n belong to the zone ZN1, the transistors 50-3 to 50-($n$−3) and 50-($n$+4) to 50-(2n−2) belong to the zone ZN2, and the transistors 50-($n$−2) to 50-($n$+3) belong to the zone ZN3.

Figure 25:
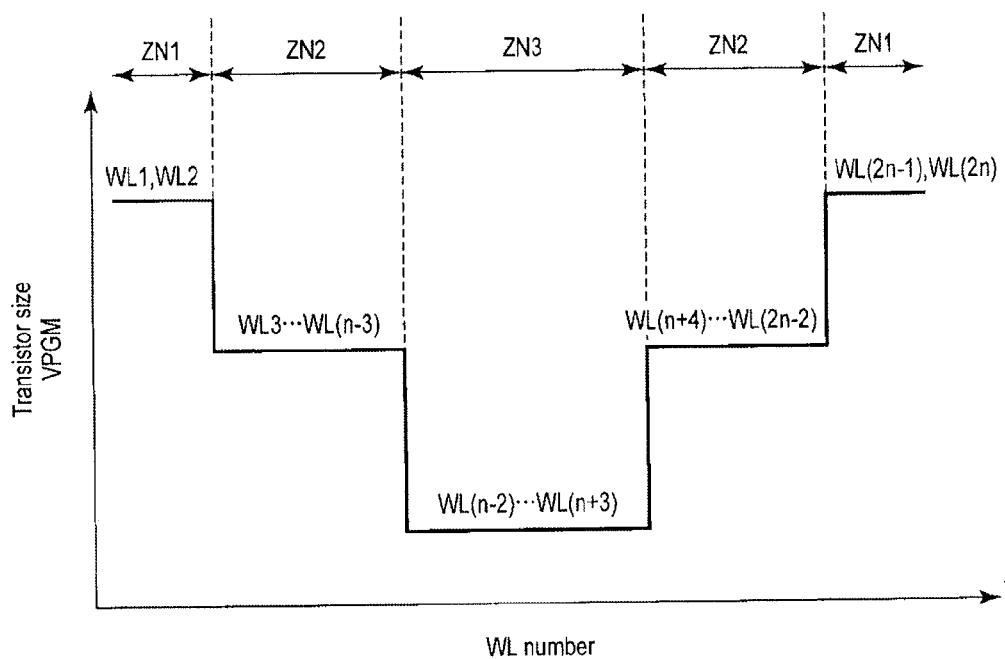
FIG. 25 is a graph which illustrates a relationship between word lines and program voltages and sizes of transistors which correspond to the word lines according to the third embodiment.

FIG. 25 is a graph which illustrates a relationship between the word lines WL and the size of the transistors 50 and the maximum transferable program voltage which correspond thereto.

As illustrated in the diagram, the transistors 50 which belong to the same zone have the same transistor size and the maximum transferable program voltages are also the same. As described in the first and second embodiments, the transistor size and the size of the program voltage depend on the size of the corresponding memory hole.

3.3 Effect According to Present Embodiment

In a case of the configuration according to the present embodiment, the sizes of the maximum transferable program voltage VPGM and the transistors 50 vary according to the zone unit. Owing to this, it is possible to simplify the layout setting of the transistors 50. Furthermore, with the configuration according to the present embodiment, the same effects as in the first and second embodiments described above are obtained.

4. Fourth Embodiment

Next, description will be given of a semiconductor memory device according to a fourth embodiment. The present embodiment illustrates a case where the memory hole 24 in the first to third embodiments described above is formed by being divided into two steps. Below, description will be given only of points that the fourth embodiment is different from the first embodiment.

4.1 Configuration of Memory Cell Array 10

Figure 26:
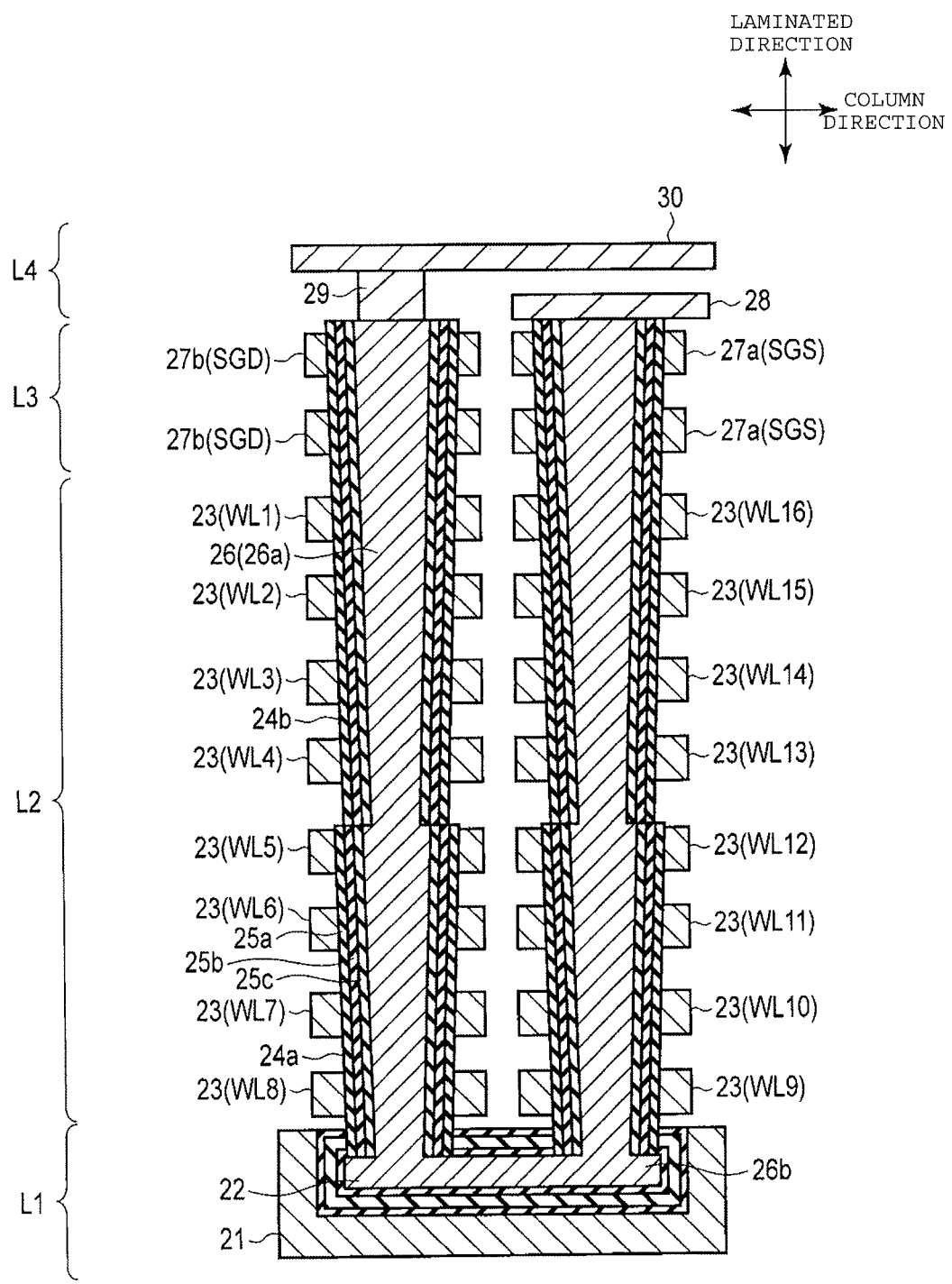
FIG. 26 is a cross-sectional diagram of a memory cell array according to a fourth embodiment.

FIG. 26 is a cross-sectional diagram of the NAND string 16 according to the present embodiment. As illustrated in the diagram, the NAND string 16 according to the present embodiment includes, for example, sixteen (eight layers) memory cell transistors. Naturally, the number is only an example and may be thirty two (sixteen layers), sixty four (thirty two layers), or the like. In addition, the memory hole 24 is formed in two steps. One memory hole 24a has a taper shape which passes through the word lines WL5 to WL8 from the upper layer and the other memory hole 24a has a taper shape which passes through the word lines WL12 to WL9 from the upper layer. In addition, one memory hole 24b has a taper shape which passes through the selection gate line SGD and the word lines WL1 to WL4 from the upper layer and the other memory hole 24b has a taper shape which passes through the selection gate line SGS and the word lines WL16 to WL13 from the upper layer. The semiconductor layers 26 of the memory holes 24a and 24b are connected with each other; however, the block insulation layer 25a, the charge storage layer 25b, and the tunnel insulating layer 25c may be non-continuous between the word lines WL4 and WL5 and between WL12 and WL13.

4.2 Method of Forming Memory Hole

Description will be given of the method of forming the memory hole 24. Firstly, the first memory hole 24a is formed in the stage where the word lines WL5 to WL12 are formed. Then, the block insulating layer 25a, the charge storage layer 25b, and the tunnel insulating layer 25c are formed in order inside the first memory hole 24a and the semiconductor layer 26 is further formed. As a result, the first memory hole 24a is filled in.

Next, the second memory hole 24b is formed after the word lines WL1 to WL4, WL13 to WL16, and the selection gate lines SGD and SGS are formed. Then, in the same manner as the first memory hole 24a, the second memory hole 24b is filled in by the block insulating layer 25a, the charge storage layer 25b, the tunnel insulating layer 25c, and the semiconductor layer 26. The second memory hole 24b is formed such that the bottom section thereof reaches the upper surface of the first memory hole 24a. Then, since the memory holes 24a and 24b have a taper shape, the diameter of the bottom surface of the second memory hole 24b is smaller than the diameter of the upper surface of the first memory hole 24a.

4.3 Transistors 50

Figure 27:
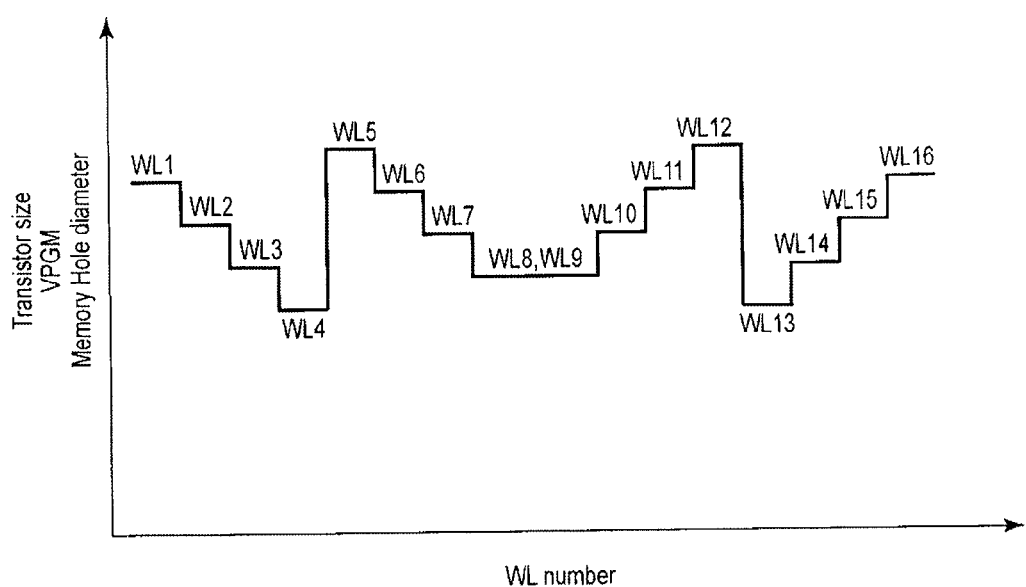
FIG. 27 is a graph which illustrates a relationship between word lines and memory hole diameters, program voltages, and sizes of transistors which correspond to the word lines according to the fourth embodiment.

FIG. 27 is a graph which illustrates a relationship between the word lines WL1 to WL16 and the diameter D of the memory holes 24, the maximum transferable program voltage VPGM, and the size of the transistors 50 which correspond thereto.

As illustrated in the diagram, when focusing on the word lines WL1 to WL4, the diameters D1 to D4 of the memory holes have a relationship where D1>D2>D3>D4. Accordingly, the voltages VPGM1 to VPGM4 have a relationship where VPGM1>VPGM2>VPGM3>VPGM4 and the sizes TS1 to TS4 of the transistors 50-1 to 50-4 have a relationship where TS1>TS2>TS3>TS4. In the same manner, the sizes of the diameters D5 to D8 of the memory holes of the word lines WL5 to WL8 also have a relationship where D5>D6>D7>D8. Accordingly, voltages VPGM5 to VPGM8 have a relationship where VPGM5>VPGM6>VPGM7>VPGM8 and sizes TS5 to TS8 of transistors 50-5 to 50-8 have a relationship where TS5>TS6>TS7>TS8. The same also applies to the case of WL9 to WL16.

4.4 Effect According to Present Embodiment

As described in the first embodiment, it is possible for the three-dimensional stacked type NAND type flash memory to improve the degree of integration to the extent that the number of the word line layers is increased. However, on the other hand, the depth of the memory hole is deep and the aspect ratio increases. When the aspect ratio increases, it is hard to form the memory hole and opening failures easily occur in the memory hole.

In contrast to this, in the case of the configuration according to the present embodiment, it is possible to prevent the opening failures by opening the memory hole by dividing the opening into a plurality of steps. Accordingly, it is possible to improve the degree of integration of the word lines. Owing to this, it is possible to highly integrate the semiconductor memory device. Furthermore, with the configuration according to the present embodiment, the same effects as in the first to third embodiments described above are obtained. Here, in the present example, description is given using a case where the memory hole 24 is formed in two steps as an example; however, there may be three or more steps.

5. Fifth Embodiment

Next, description will be given of a semiconductor memory device according to a fifth embodiment. The present embodiment relates to the case where the shape of the memory hole 24 in the first to fourth embodiments has a bowed shape. Below, description will be given only of points that the fifth embodiment is different from the first to fourth embodiments.

5.1 Configuration of Memory Cell Array 10

Figure 28:
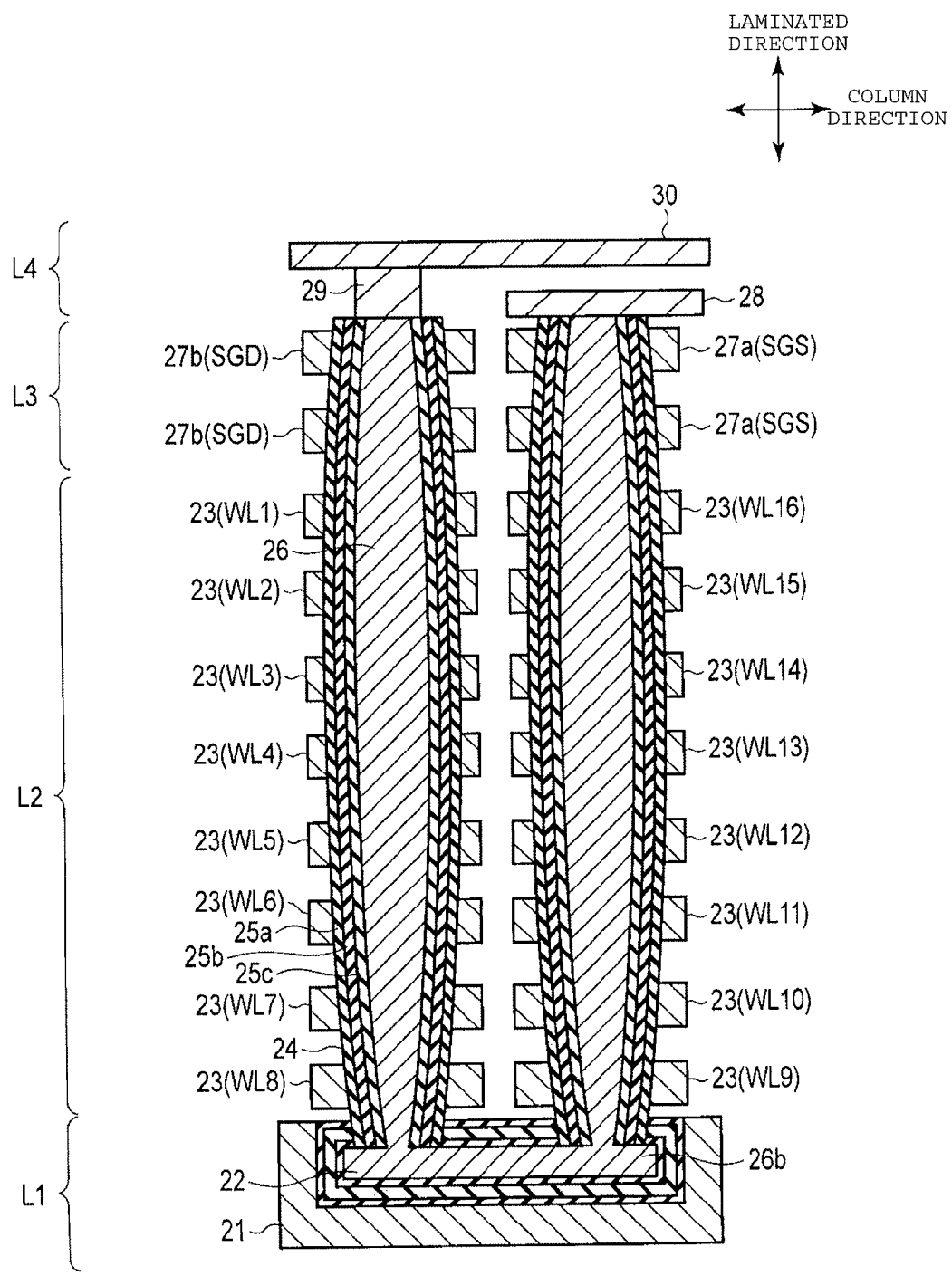
FIG. 28 is a cross-sectional diagram of a memory cell array according to a fifth embodiment.
Figure 29:
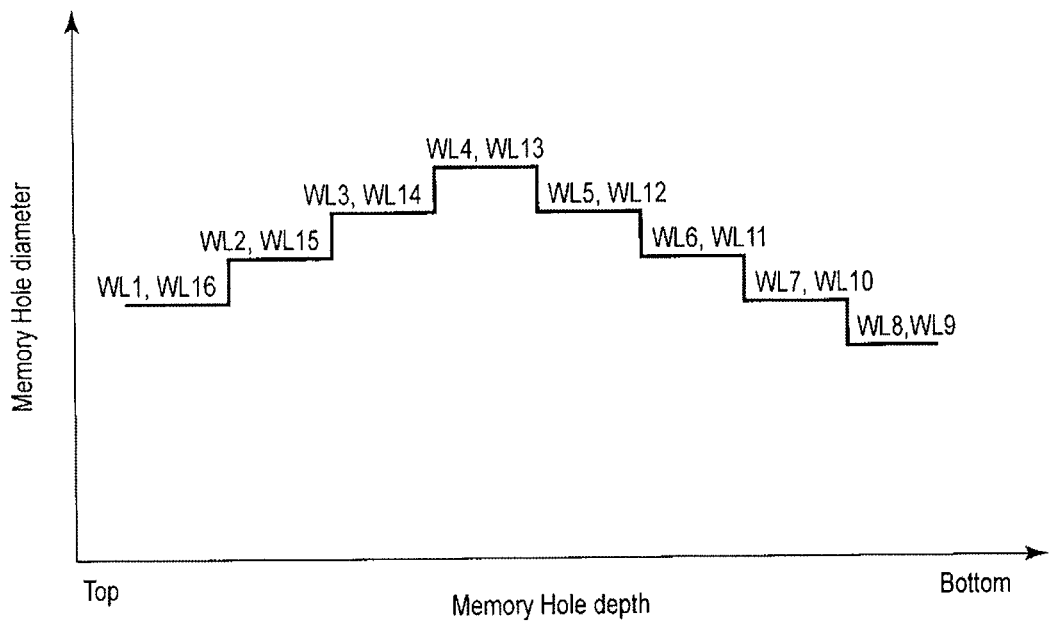
FIG. 29 is a graph which illustrates a relationship between a depth and a diameter of a memory hole according to the fifth embodiment.

FIG. 28 is a cross-sectional diagram of the NAND string 16 according to the present embodiment. As illustrated in the diagram, the NAND string 16 according to the present embodiment includes, for example, sixteen memory cell transistors. In addition, the memory hole 24 has a bowed shape. FIG. 29 is a graph which illustrates a relationship between the diameter D and the depth of the memory hole 24. As illustrated in the diagram, in a case of the bowed shape, that is, the memory hole 24 has a shape which has the maximum diameter at the middle height and where the diameter is smaller toward the upper end and the lower end.

5.2 Transistors 50

Figure 30:
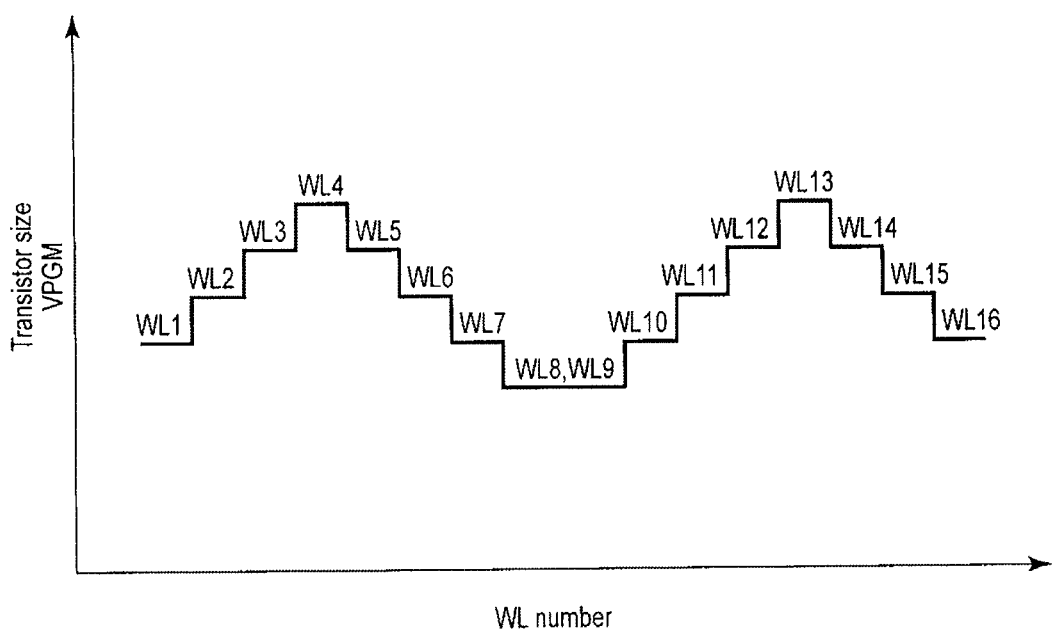
FIG. 30 is a graph which illustrates a relationship between word lines and program voltages and sizes of transistors which correspond to the word lines according to the fifth embodiment.

FIG. 30 is a graph which illustrates a relationship between the word lines WL1 to WL16 and the size of the transistor 50 and the maximum program voltage which the transistors 50 are able to transfer which correspond thereto. As illustrated in the diagram, in the same manner as the embodiments described above, the larger the diameter of the memory hole 24 which passes through the corresponding word line WL is, the larger the size of the transistor 50 is. Then, with the present embodiment, the transistor 50 which corresponds to the word lines WL4 and WL13 on the intermediate layer is formed with the maximum size and the transistor size is smaller in the word lines WL1, WL8, WL9, and WL16 on the upper layer and the lower layer. The same also applies to the maximum transferable voltage.

5.3 Effect According to Present Embodiment

The shape of the memory hole 24 varies according to the processing characteristics at the time of memory hole opening. Then, it is possible to apply the embodiment described above to the memory holes 24 with various shapes and the same effects are obtained.

6. Sixth Embodiment

Next, description will be given of a semiconductor memory device according to a sixth embodiment. In the present embodiment, the configuration of the memory cell array 10 in the first to fifth embodiments is modified. Below, description will be given only of points that the sixth embodiment is different from the first to fifth embodiments.

6.1 First Example of Memory Cell Array 10

Figure 31:
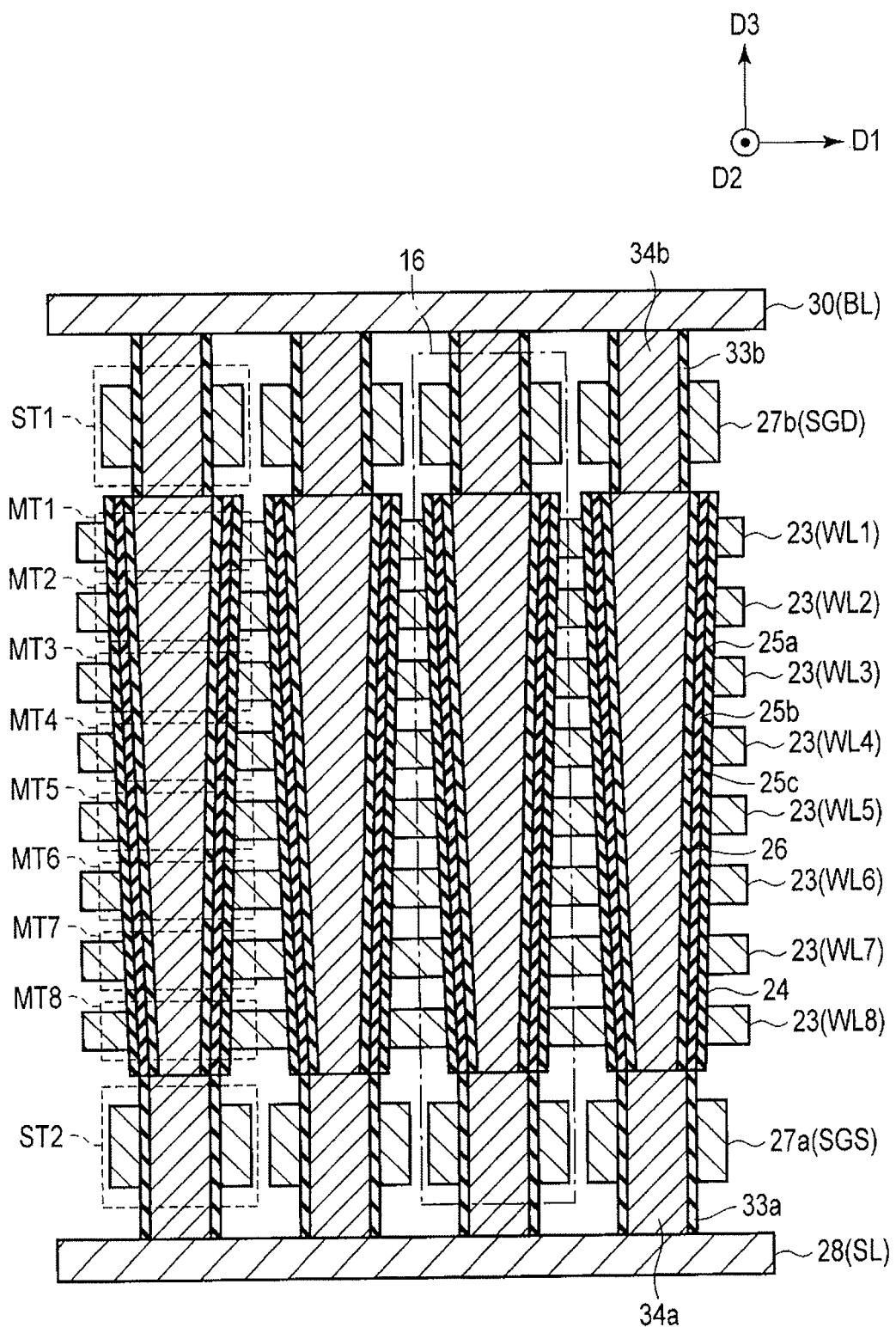
FIG. 31 is a cross-sectional diagram of a memory cell array according to a first example of a sixth embodiment.

FIG. 31 is a cross-sectional diagram along the bit line direction of the memory cell array 10 according to the first example of the present embodiment and corresponds to FIG. 4 described in the first embodiment.

As illustrated in the diagram, the NAND string 16 may have the shape of a single column instead of the U shape as described in FIG. 4. In this case, as illustrated in FIG. 31, the source line layer 28 is formed above the semiconductor substrate (which is not illustrated in the diagram) and a plurality of the semiconductor layers 34 and 26 with a columnar shape are formed on the source line layer 28. Then, the select transistor ST2, word lines WL8 to WL1 (memory cell transistors MT8 to MT1), and the select transistor ST1 are formed in order from the bottom at the periphery of the semiconductor layers 34 and 26 and the bit line layer 30 is further formed. In the case of the present configuration, the back gate transistor BT is not necessary.

The diameters D1 to D8 of the memory holes 24 which pass through the word lines WL1 to WL8 in FIG. 31 have a relationship where D1>D2> . . . >D8. Accordingly, the sizes TS1 to TS8 of the corresponding memory cell transistors MT1 to MT8 also have a relationship where TS1>TS2> . . . >TS8.

Then, the size of the transistors 50 are also set according to the sizes of the memory cell transistors MT. That is, the transistors 50 which correspond to the word lines WL through which the memory holes 24 which are large pass are formed such that the sizes thereof are large and the maximum transferable voltages are large.

6.2 Second Example of Configuration of Memory Cell Array 10

Figure 32:
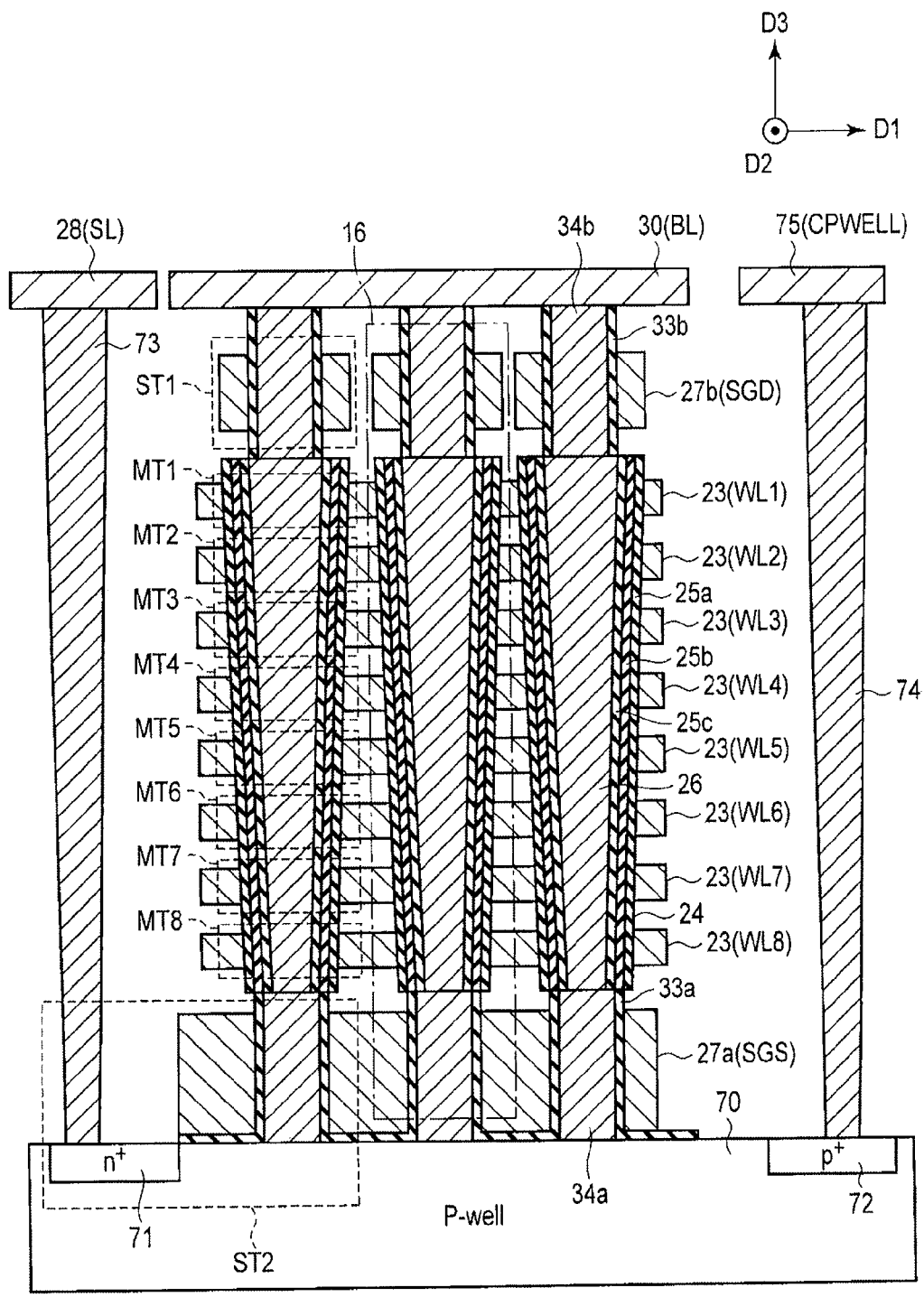
FIG. 32 is a cross-sectional diagram of a memory cell array according to a second example of the sixth embodiment.

FIG. 32 is a cross-sectional diagram along the bit line direction of the memory cell array 10 according to a second example of the present embodiment and corresponds to FIG. 4 described in the first embodiment in the same manner as the first example.

In the second example, the NAND string 16 may be formed, for example, on a p type well region 70. A semiconductor layer 34a is formed on the well region 70. In addition, an $n^+$ type impurity diffusion layer 71 and $p^+$ type impurity diffusion layer 72 are formed in the well region 70. Then, a contact plug 73 is formed on the diffusion layer 71 and the source line layer 28 is formed so as to be connected with the contact plug 73. In addition, a contact plug 74 is formed on the diffusion layer 72 and a well line layer 75 is formed so as to be connected with the contact plug 74. A well line CPWELL is wiring for imparting a potential to the well region 70. The source line layer 28 and the well line layer 75 are formed, for example, by the same layer as the bit line layer 30.

In addition, the selection gate lines SGS is connected in common in the blocks BLK. A gate insulating film 33a of the select transistor ST2 is formed not only on the side surface of the semiconductor layer 34a but also on the well region 70 and is connected in common between the string units SU. Furthermore, the conductive layer 27a of the select transistor ST2 is filled in the region between the semiconductor layers 34a which are adjacent to each other and is formed up to the vicinity of the diffusion layer 71.

According to the present configuration, the select transistor ST2 functions as four terminal devices (a gate, a source, a drain, and a substrate). Then, it is possible to impart a voltage to the well region 70 and the semiconductor layer 26 using the well line CPWELL. Accordingly, it is possible to erase data by FN tunneling by imparting a positive voltage to the well line CPWELL and imparting 0 V or a negative voltage to the word line WL.

In addition, when reading data, the channel of the select transistor ST2 is formed not only on the side surface of the semiconductor layer 34a, but also on the surface of the well region 70 along the gate insulating film 33a. Owing to this, the current paths of each of the NAND strings 16 are electrically connected with the source lines SL via the diffusion layer 71 and the contact plug 73. Accordingly, the film thickness of the gate insulating film 33a between the well region 70 and the conductive layer 27a is set to the same extent as the film thickness of the gate insulating film 33a between the semiconductor layer 34a and the conductive layer 27a.

In the same manner as FIG. 31, in the case of FIG. 32, the transistor size is as large as the size of the memory cell transistor MT on the upper layer. Then, the same applies to the sizes of the transistor 50.

6.4 Effect According to Present Embodiment

As described above, it is possible to also apply the first to fifth embodiments to the NAND type flash memory which has the structure according to the present embodiment.

7. Seventh Embodiment

Next, description will be given of a semiconductor memory device according to a seventh embodiment. The present embodiment relates to the configuration of the memory cell array 10, which is different from those of the first to sixth embodiments. Below, description will be given only of points that the seventh embodiment is different from the first to sixth embodiments.

7.1 First Example of Configuration of Memory Cell Array 10

Figure 33:
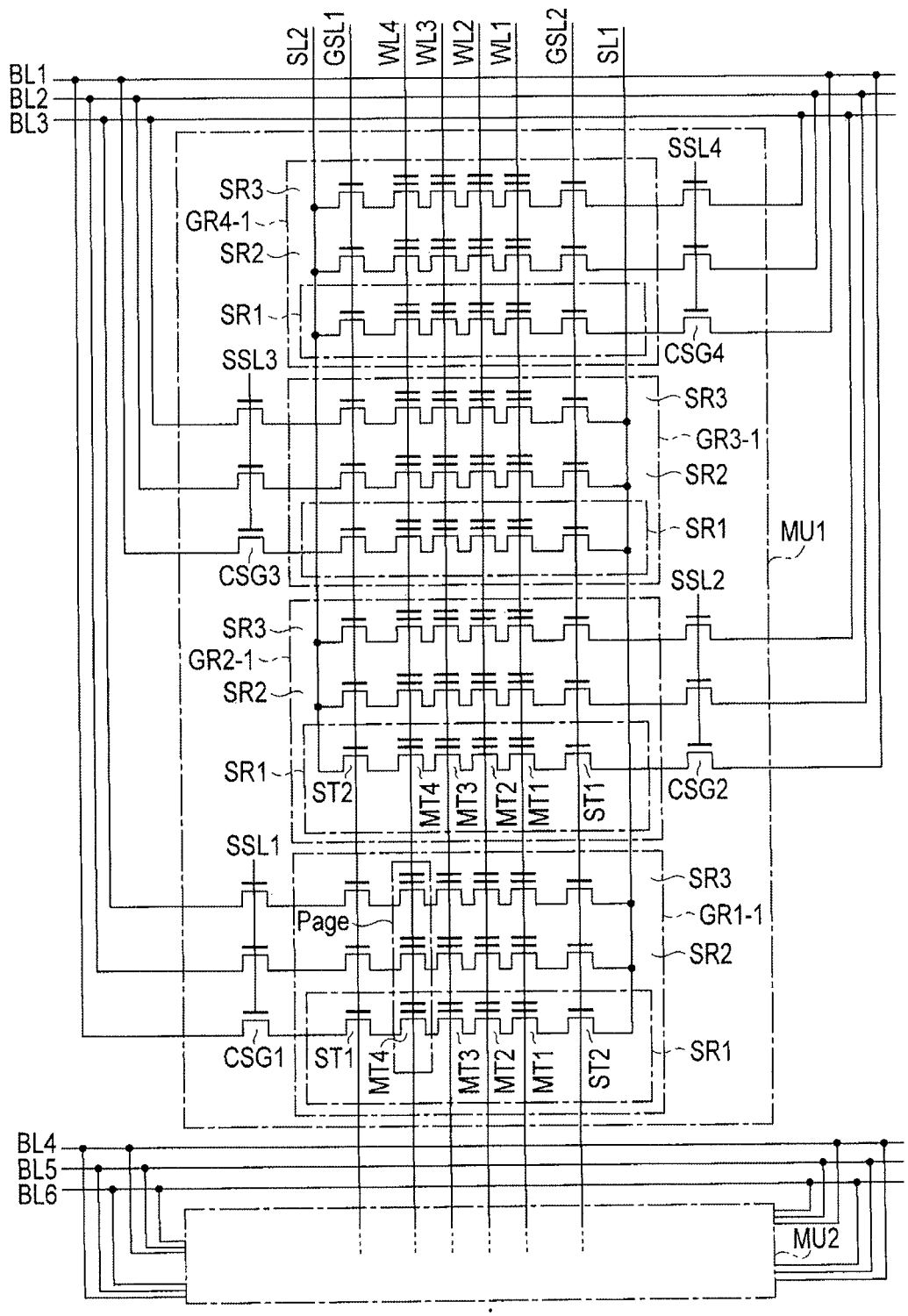
FIG. 33 is a circuit diagram of a memory cell array according to a first example of a seventh embodiment.

FIG. 33 is a circuit diagram of the memory cell array 10 according to a first example of the present embodiment and illustrates the configuration of any one of the blocks BLK. As illustrated in the diagram, the block BLK is provided with a plurality of memory units MU (MU1 and MU2). Only two memory units MU are illustrated in FIG. 33; however, there may be three or more and the number is not limited.

Each of the memory units MU is provided with, for example, four string groups GR (GR1 to GR4). Here, when distinguishing between the memory units MU1 and MU2, the string groups GR of the memory unit MU1 are respectively referred to as GR1-1 to GR4-1 and the string groups GR of the memory unit MU2 are respectively referred to as GR1-2 to GR4-2.

Each of the string groups GR is provided with, for example, three NAND strings SR (SR1 to SR3). Naturally, the number of the NAND strings SR is not limited to three and may be four or more. Each of the NAND strings SR is provided with select transistors ST1 and ST2 and four memory cell transistors MT (MT1 to MT4). The number of the memory cell transistors MT is not limited to four, and may be five or more, or may be three or less.

In the string groups GR, the three NAND strings SR1 to SR3 are stacked in order on the upper part of the semiconductor substrate, the NAND string SR1 is formed on the lowermost layer, and the NAND string SR3 is formed on the uppermost layer. That is, while the memory cell transistors MT in the NAND string are stacked in the direction which is orthogonal to the semiconductor substrate in FIG. 4 described in the first embodiment, the memory cell transistors MT in the NAND string are arranged in the direction which is parallel with the semiconductor substrate and the NAND strings are stacked in the orthogonal direction in the present embodiment. Then, the select transistors ST1 and ST2 which are included in the same string groups GR are respectively connected with the same selection gate lines GSL1 and GSL2 and the control gate of the memory cell transistor MT which is positioned in the same row is connected with the same word line WL. Furthermore, the drains of the three select transistors ST1 in a certain string group GR are connected with the bit lines BL which are different from each other and the sources of the select transistors ST2 are connected with the same source line SL.

The select transistors ST1 and ST2 of the string groups GR1 and GR3 which are odd numbered and the select transistors ST1 and ST2 of the string groups GR2 and GR4 which are even numbered are arranged such that the positional relationships thereof are reversed. That is, in the example in FIG. 20, the select transistors ST1 of the string groups GR1 and GR3 are arranged at the left end of the NAND string SR and the select transistors ST2 are arranged at the right end of the NAND string SR. In contrast to this, the select transistors ST1 of the string groups GR2 and GR4 are arranged at the right end of the NAND string SR and the select transistors ST2 are arranged at the left end of the NAND string SR.

Then, the gates of the select transistors ST1 of the string groups GR1 and GR3 are connected with the same selection gate line GSL1 and the gates of the select transistors ST2 are connected with the same selection gate line GSL2. On the other hand, the gates of the select transistors ST1 of the string groups GR2 and GR4 are connected with the same selection gate line GSL2 and the gates of the select transistors ST2 are connected with the same selection gate line GSL1.

In addition, the four string groups GR1 to GR4 which are included in one memory unit MU are all connected to the same bit line BL and the string groups which are included in the memory units MU which are different from each other are connected with the bit lines BL which are different from each other. More specifically, the drains of the select transistors ST1 of the NAND strings SR1 to SR3 in the string groups GR1 to GR4 in the memory unit MU1 are respectively connected with the bit lines BL1 to BL3 via column selection gates CSG (CSG1 to CSG4). The column selection gates CSG have the same configuration as, for example, the memory cell transistor MT, the select transistors ST1 and ST2, and select one string group GR which is selected in the bit line BL in each of the memory units MU. Accordingly, the gates of the column selection gates CSG1 to CSG4 which respectively correspond to the string groups GR are respectively controlled by the control signal lines SSL1 to SSL4 which are different from each other.

A plurality of the memory units MU which have the configuration described above are arranged in the word line direction. The plurality of the memory units MU share the memory unit MU1, the word lines WL, and the selection gate lines GSL1 and GSL2. On the other hand, the bit lines BL are independent and, for example, three bit lines BL4 to BL6 which are different from the memory unit MU1 correspond to the memory unit MU2. The number of the bit lines BL which correspond to each of the memory units MU corresponds to the total number of the NAND strings SR which are included in one string group GR. Accordingly, when there are four layers of the NAND strings, four bit lines BL are also provided and the same applies in cases of other numbers. In addition, the control signal lines SSL1 to SSL4 may be in common between the memory units MU or may be controlled independently.

In the configuration described above, a collection of a plurality of the memory cell transistors MT which are connected with the same word line WL in the string groups GR which are selected one by one from each of the memory units MU is a "page".

Figure 34:
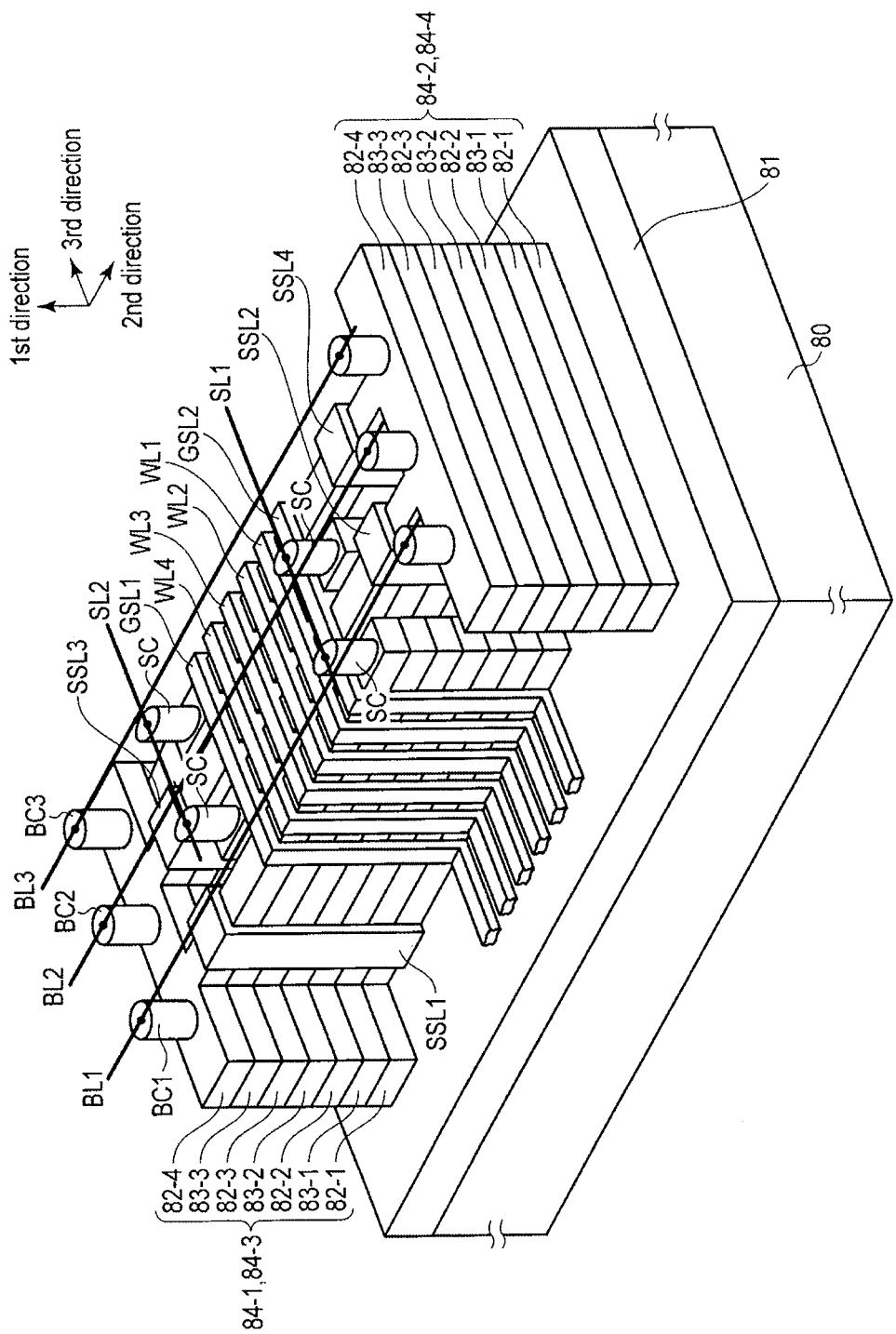
FIG. 34 is a perspective diagram of the memory cell array according to the first example of the seventh embodiment.
Figure 35:
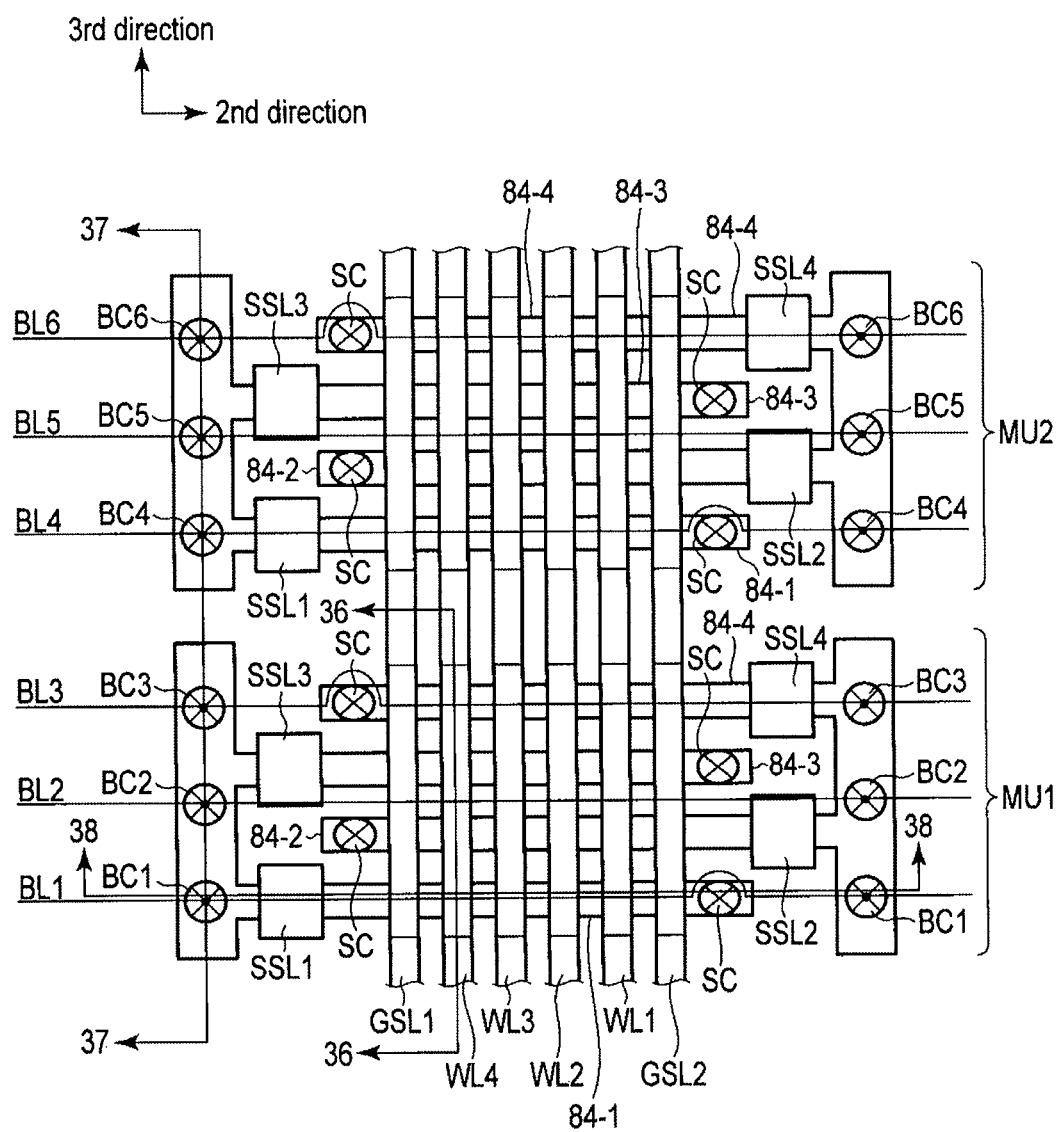
FIG. 35 is a planar diagram of the memory cell array according to the first example of the seventh embodiment.
Figure 36:
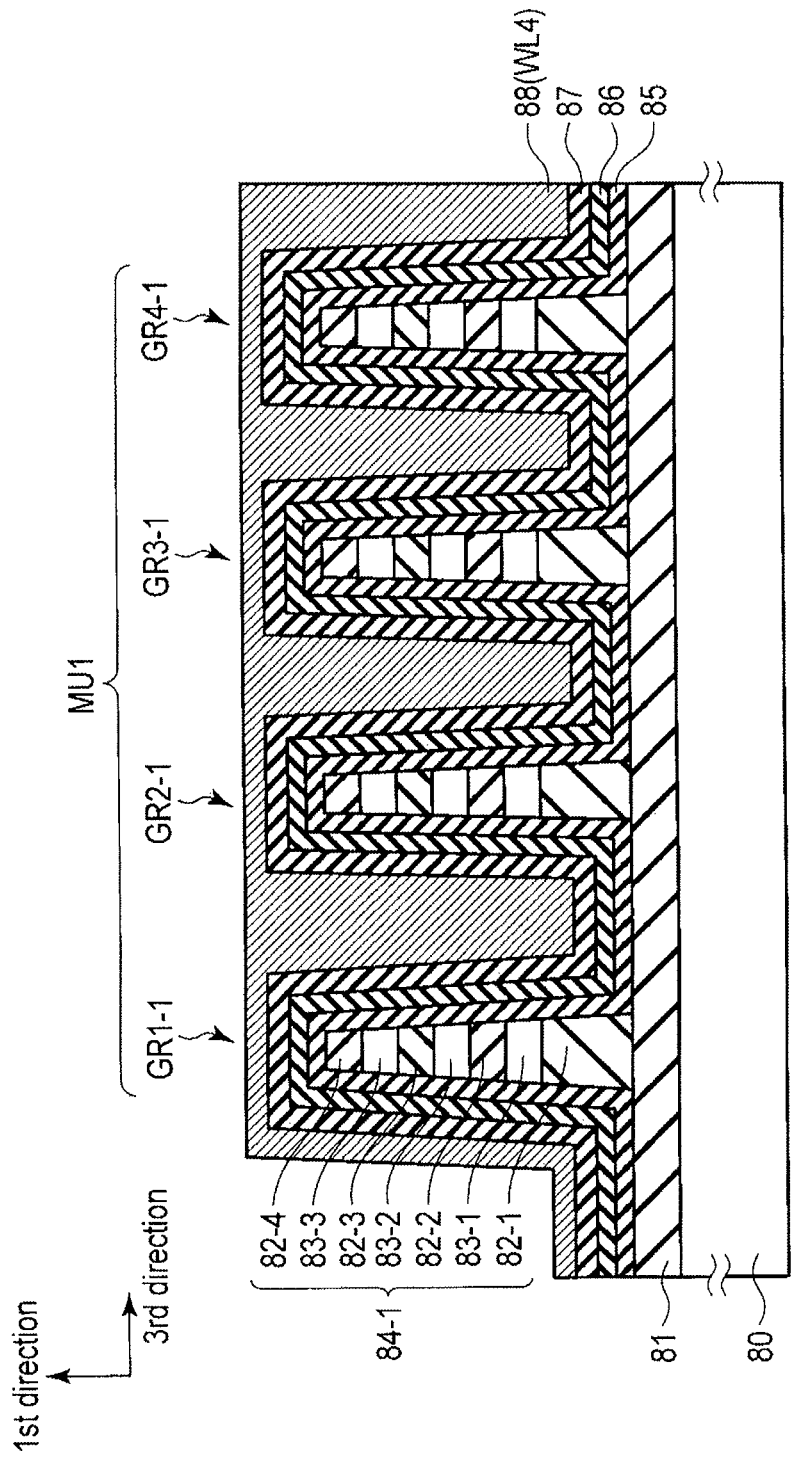
FIG. 36 illustrates a cross-section taken along line 36-36 in FIG. 35.
Figure 37:
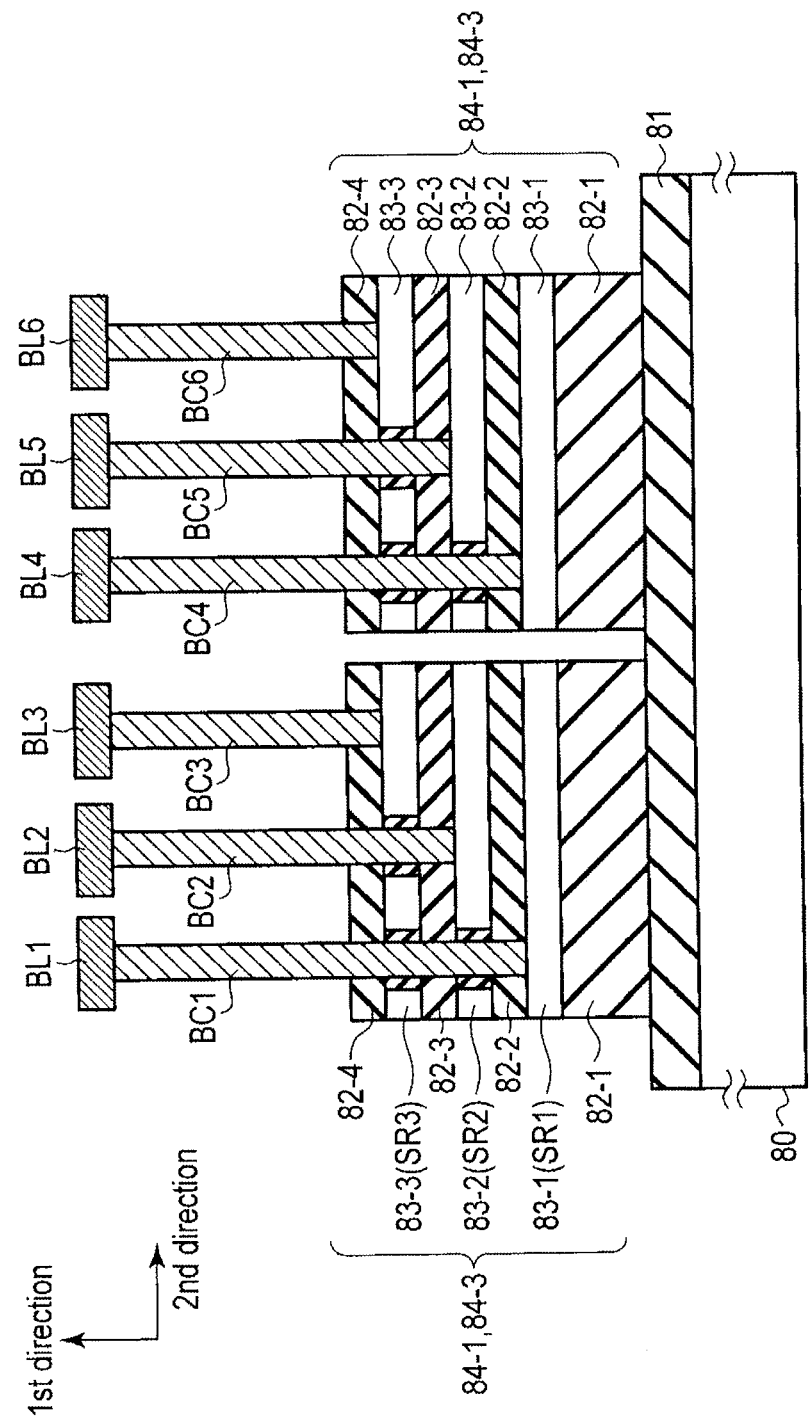
FIG. 37 illustrates a cross-section taken along line 37-37 in FIG. 35.
Figure 38:
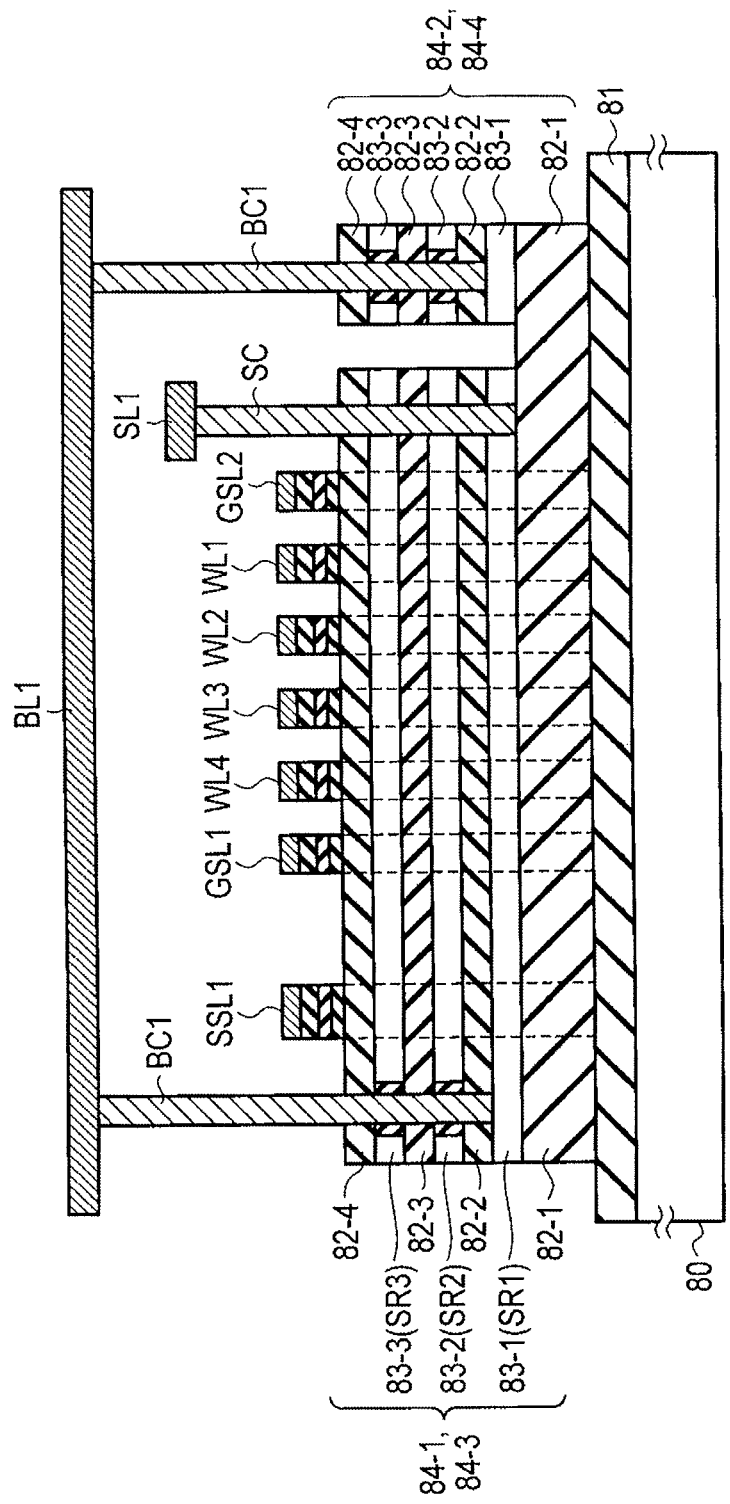
FIG. 38 illustrates a cross-section taken along line 38-38 in FIG. 35.

FIG. 34 and FIG. 35 are a perspective diagram and a planar diagram of the block BLK, FIG. 36 is a cross-sectional diagram taken along a line 36-36 in FIG. 35, FIG. 37 is a cross-sectional diagram taken along a line 37-37 in FIG. 35, and FIG. 38 is a cross-sectional diagram along a line 38-38 in FIG. 35. FIG. 34, FIG. 36, and FIG. 38 illustrate one memory unit MU and FIG. 35 and FIG. 37 illustrate two memory units MU1 and MU2.

As illustrated in the diagram, an insulating film 81 is formed on a semiconductor substrate 80 and the block BLK is formed on the insulating film 81.

One memory unit MU is formed on the insulating film 81 by, for example, four fin type structures 84 (84-1 to 84-4) with a stripe shape being formed along the second direction which is perpendicular with the first direction which is a direction which is orthogonal with regard to the surface of the semiconductor substrate 80. Each of the fin type structures 84 includes insulating films 82 (82-1 to 82-4) and semiconductor layers 83 (83-1 to 83-3) which are provided along the second direction. Four stacked structures which extend in an orthogonal direction with regard to the surface of the semiconductor substrate 80 are formed in each of the fin type structures 84 by the insulating films 82-1 to 82-4 and the semiconductor layers 83-1 to 83-3 being alternately stacked. Each of the fin type structures 84 corresponds to the string groups GR described in FIG. 33. Then, the semiconductor layer 83-1 on the lowermost layer corresponds to the current path (a region where a channel is formed) of the NAND string SR1, the semiconductor layer 83-3 on the uppermost layer corresponds to the current path of the NAND string SR3, and the semiconductor layer 83-2 which is positioned therebetween corresponds to the current path of the NAND string SR2.

A tunnel insulating layer 85, a charge storage layer 86, a block insulating layer 87, and a control gate 88 are formed in order on the upper surface and the side surface of the fin type structure 84 (refer to FIG. 36). The control gate 88 is formed by a conductive film and functions as the word lines WL or the selection gate lines GSL1 and GLS2. The word lines WL and the selection gate lines GSL1 and GLS2 are formed among a plurality of the memory units MU so as to cross a plurality of the fin type structures 84. On the other hand, the control signal lines SSL1 to SSL4 are independent for each individual fin type structure 84.

One end section of the fin type structure 84 is taken out to the end section of the block BLK and is connected with the bit lines BL in the region where the fin type structure 84 is taken out. That is, when focusing on the memory unit MU1 as an example, one end sections of the fin type structures 84-1 and 84-3 which are odd numbered are connected in common by being taken out up to a certain region along the second direction and contact plugs BC1 to BC3 are formed in this region. The contact plug BC1 which is formed in this region connects the semiconductor layer 83-1 and the bit line BL1 of the string groups GR1 and GR3, and the semiconductor layers 83-2 and 83-3 are insulated. The contact plug BC2 connects the semiconductor layer 83-2 and the bit line BL2 of the string groups GR1 and GR3, and the semiconductor layers 83-1 and 83-3 are insulated. The contact plug BC3 connects the semiconductor layer 83-3 and the bit line BL3 of the string groups GR1 and GR3, and the semiconductor layers 83-1 and 83-2 are insulated.

On the other hand, one end sections of the fin type structures 84-2 and 84-4 which are even numbered are connected in common by being taken out up to a region which is opposed to one end sections of the fin type structures 84-1 and 84-3 in the second direction and the contact plugs BC1 to BC3 are formed in this region. The contact plug BC1 which is formed in this region connects the semiconductor layer 83-1 and the bit line BL1 of the string groups GR2 and GR4, and the semiconductor layers 83-2 and 83-3 are insulated. The contact plug BC2 connects the semiconductor layer 83-2 and the bit line BL2 of the string groups GR2 and GR4, and the semiconductor layers 83-1 and 83-3 are insulated. The contact plug BC3 connects the semiconductor layer 83-3 and the bit line BL3 of the string groups GR2 and GR4, and the semiconductor layers 83-1 and 83-2 are insulated.

Naturally, the description above is in the case of the memory unit MU1 and, for example, in the case of the memory unit MU2, the contact plugs BC4 to BC6 are formed and these connect the semiconductor layers 83-1 to 83-3 with the bit lines BL4 to BL6 (refer to FIG. 37) respectively.

In addition, a contact plug SC is formed on the other end of the fin type structure 84. The contact plug SC connects the semiconductor layers 83-1 to 83-3 with the source line SL.

7.2 Second Example of Configuration of Memory Cell Array 10

Figure 39:
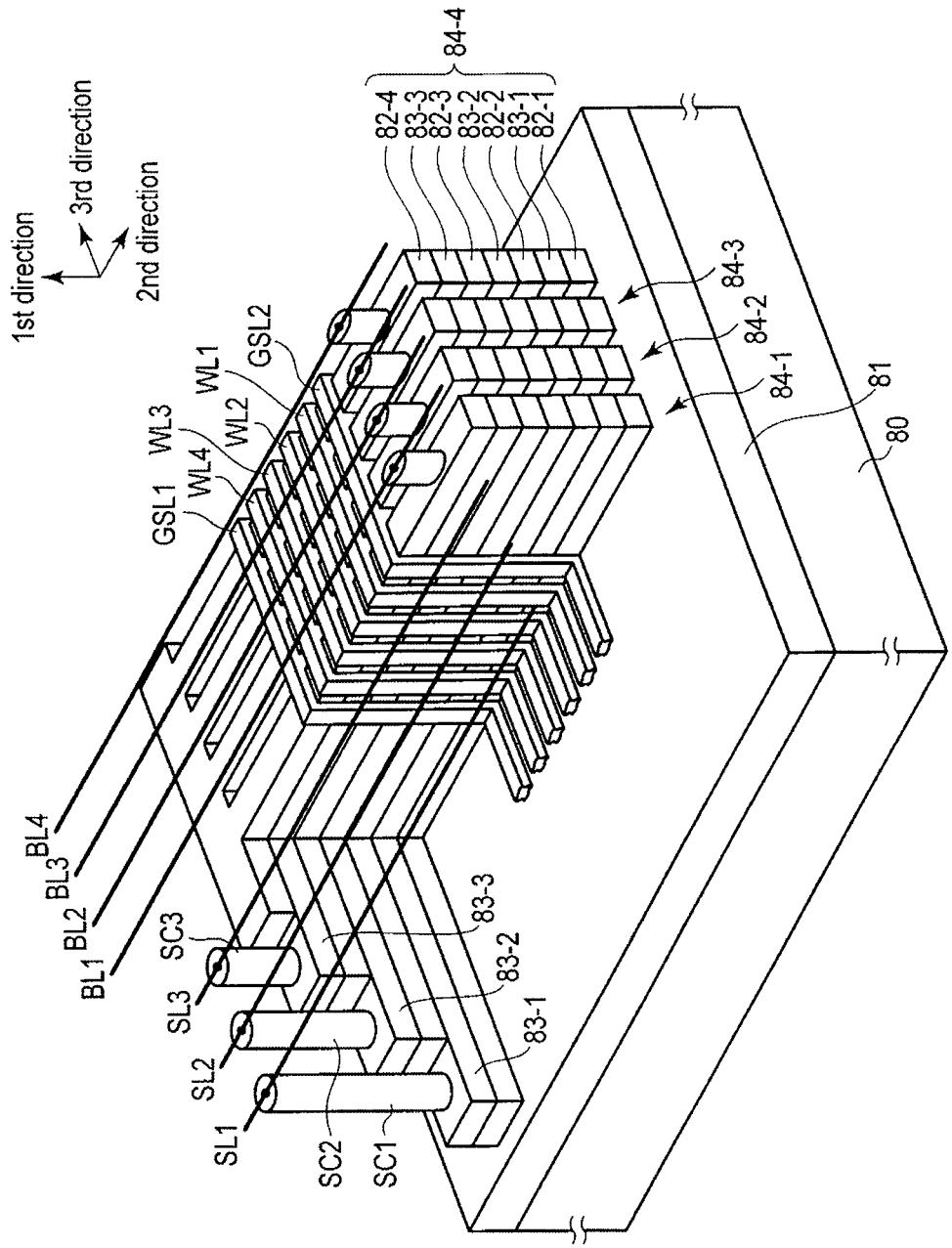
FIG. 39 is a perspective diagram of a memory cell array according to a second example of the seventh embodiment.
Figure 40:
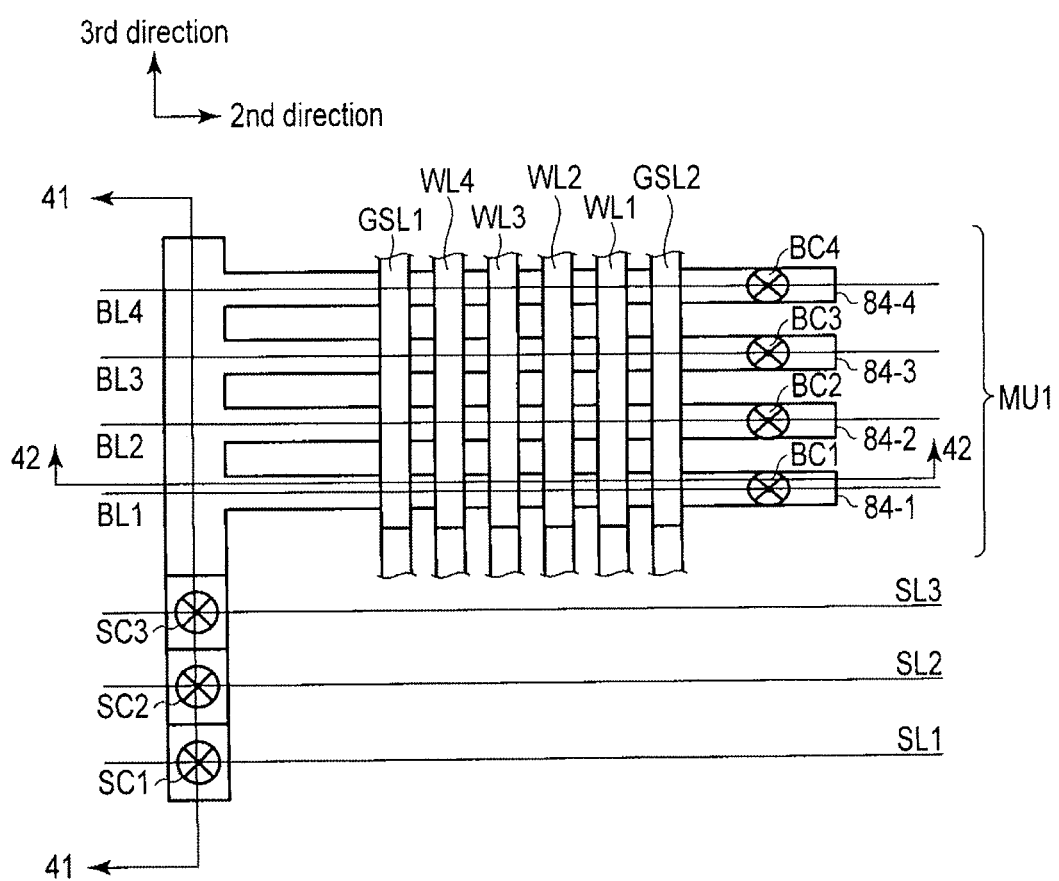
FIG. 40 is a planar diagram of the memory cell array according to the second example of the seventh embodiment.
Figure 41:
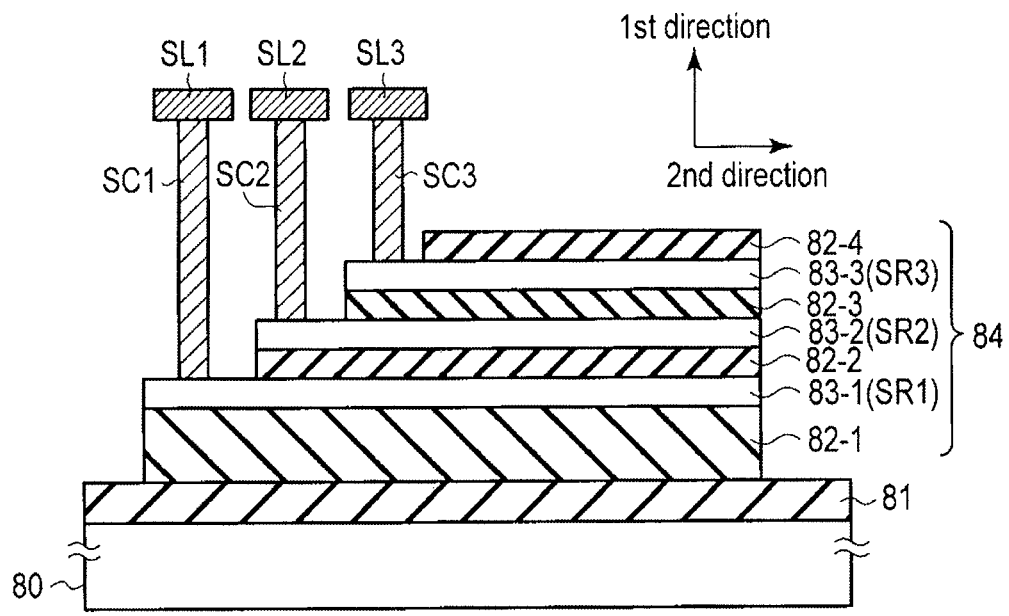
FIG. 41 illustrates a cross-section taken along line 41-41 in FIG. 40.
Figure 42:
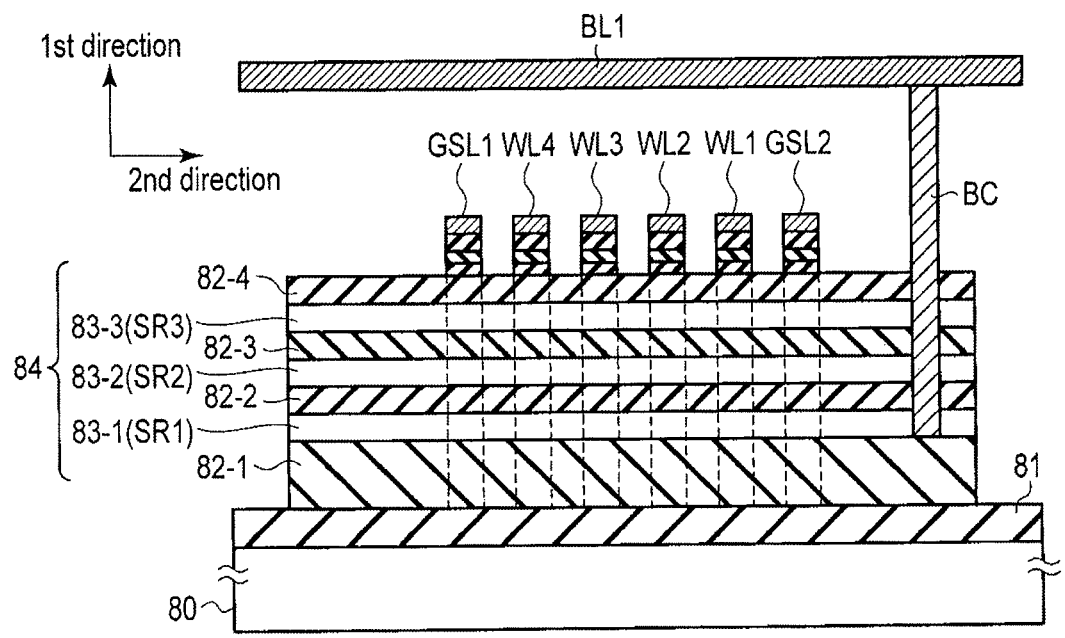
FIG. 42 illustrates a cross-section taken along line 42-42 in FIG. 40.

FIG. 39 is a perspective diagram of the block BLK according to a second example of the seventh embodiment. As illustrated in the diagram, the second example is different from the first example and the NAND strings SR1 to SR3 are selected by the source line SL. FIG. 39 is a perspective diagram of the block BLK according to the present embodiment and illustrates any one memory unit MU. FIG. 40 is a planar diagram of the memory unit MU, FIG. 41 is a cross-sectional diagram taken along a line 41-41 in FIG. 40, and FIG. 42 is a cross-sectional diagram taken along a line 42-42 in FIG. 40.

As illustrated in the diagram, in the configuration of the second example, one end sections of the plurality of the fin type structures 84 in the configuration described in the first example are taken out to the end section of the block BLK, connected with the bit lines BL in the region where the fin type structures 84 are taken out, and the other end section is connected in common and is connected with the source line SL. Then, the bit line BL is connected in common with each of the semiconductor layers 83-1 to 83-3 in the corresponding fin type structures 84 (refer to FIG. 42). On the other hand, the source lines SL are provided independently with regard to each of the semiconductor layers 83-1 to 83-3 in the fin type structures 84 which are connected in common (refer to FIG. 41). In addition, in the present example, the control signal line SSL in the first example is removed.

7.3 Size of Memory Cell Transistor MT According to First Example and Second Example The sizes of the memory cell transistors MT which are included in the NAND strings SR1 to SR3 are different from each other. More specifically, in each of the fin type structures 84 as illustrated in FIG. 37, the width along the third direction of the semiconductor layer 83 is larger when positioned lower on the layers and is smaller when positioned higher on the layers. That is, the width of the semiconductor layer 83-1 is the widest, the width of the semiconductor layer 83-3 is the narrowest, and the width of the semiconductor layer 83-2 is therebetween.

7.4 Effect According to Present Embodiment

It is also possible to apply the first to sixth embodiments described above to the configuration where the memory cell array according to the present embodiment is provided. That is, with the configuration according to the present embodiment, since the sizes of the memory cell transistors MT which are formed on different layers from each other as with the NAND strings SR1 to SR3 are different from each other, the optimum programming conditions for each of the layers are different from each other.

In the present example, since the memory cell transistors MT which are provided on a plurality of layers which are different from each other form a page, the size of the transistor which transfers writing data from the sense amplifier or the source line driver may be changed for each layer, rather than in the transfer transistors of the row decoders. Owing to this, the same effects as the first to sixth embodiments described above are obtained In addition, the depths of contact of the bit line contacts BC1 to BC3 which are respectively connected with the NAND strings SR1 to SR3 according to the first example described above are different from each other as illustrated in FIG. 38. Due to this, when the bit line contacts BC are, for example, in a taper shape, the bottom section diameter of the bit line contacts BC is smaller as the connection with the layers is lower (as the contact is deeper). Accordingly, the contact resistance of the bit line contacts BC is higher as the connection with the layers is lower (as the contact is deeper). In other words, in the bit line contacts BC1 to BC3, the contact resistance of the bit line contact BC1 is the highest, the contact resistance of the bit line contact BC3 is the lowest, and the contact resistance of the bit line contact BC2 is therebetween.

Furthermore, the depths of contact of source line contacts SC1 to SC3 which are respectively connected with the NAND strings SR1 to SR3 according to the second example described above are different from each other as illustrated in FIG. 41. As a result, when the source line contacts SC are, for example, in a taper shape, the contact resistance of the source line contacts SC is higher as the connection with the layers is lower (as the contact is deeper) in the same manner as the first example.

The size of the transfer transistor may be determined by taking this point into consideration.

8. Modified Example and the Like

As described above, the semiconductor memory device according to the embodiments is provided with the first and second memory cell transistors MT, the first and second word lines WL, the first and second transistors 50, and the first and second driver circuits 60. The first memory cell transistor MT is provided above a semiconductor substrate and is provided with a charge storage layer. The second memory cell transistor MT is provided above the first memory cell transistor MT and is provided with a charge storage layer. The first and second word lines WL are respectively connected with the first and second memory cell transistors MT. The first and second driver circuits 60 respectively output voltages to be applied to the first and second word lines WL. The first and second transistors 50 respectively connect between the first and second word lines WL and the first and second driver circuits 60. The sizes of the first transistor 50 and the second transistor 50 are different from each other.

Owing to this, it is possible to optimize the sizes of the transistors 50 which are connected with each of the word lines. As a result, it is possible to reduce the semiconductor memory device and it is possible to make further advances in refinement and achieve higher integration. In addition, it is possible to suppress the parasitic capacity and the parasitic resistance of the transistor, reduce the electricity consumption of the semiconductor memory device, and increase the speed. In addition, it is possible to improve the reliability of the write operation by providing an optimum writing voltage.

Here, the embodiment is not limited to the aspect described above and various types of modifications are possible.

8.1 First Modified Example

Figure 43:
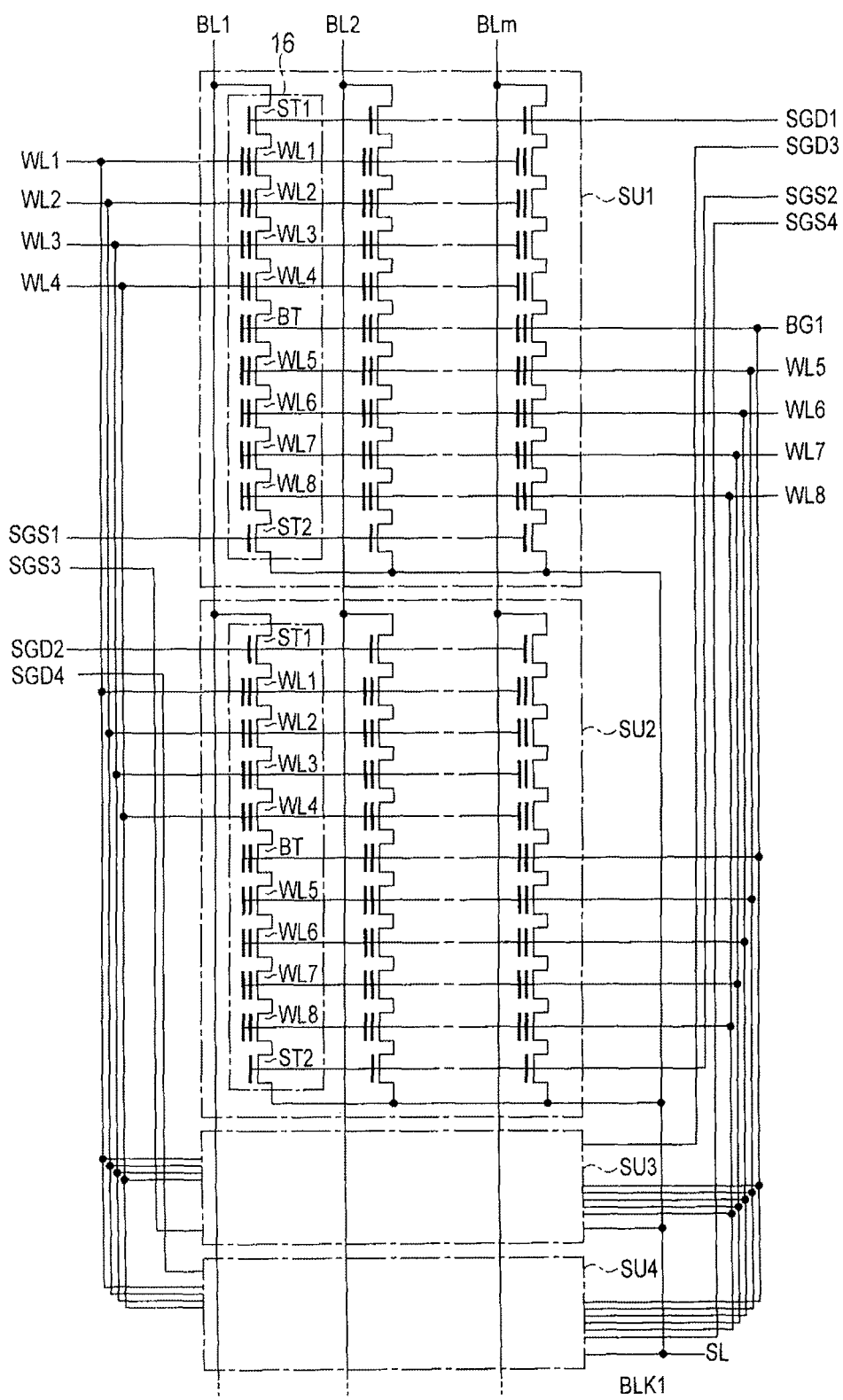
FIG. 43 is a circuit diagram of a memory cell array according to a first modified example of the first to seventh embodiments.

FIG. 43 is a circuit diagram of the block BLK1 according to a first modified example of the first embodiment. The diagram illustrates a case where the number of the memory transistors is eight. The other blocks BLK2 to BLK4 may also have the same configuration. As illustrated in the diagram, the word lines WL1 to WL4, the selection gate lines SGD2 and SGD4 which are even numbered, and the selection gate lines SGS1 and SGS3 which are odd numbered are taken out to one end side of the memory cell array 10. In contrast to this, the word lines WL5 to WL8, the selection gate lines SGD1 and SGD3 which are odd numbered, the selection gate lines SGS2 and SGS4 which are even numbered, and the back gate line BG1 are taken out to the other end side which is the opposite side to the one end side of the memory cell array. Such a configuration may be adopted.

In the present configuration, for example, the row decoders 11 are divided into two row decoders and these may be arranged so as to be opposed to interpose the memory cell array 10 therebetween. Then, the selection gate lines SGD2, SGD4, SGS1, and SGS3 and the word lines WL1 to WL4 may be selected by one row decoder and the selection gate lines SGD1, SGD3, SGS2, and SGS4 and the word lines WL5 to WL8 and the back gate line BG1 may be selected by the other row decoder.

According to the present configuration, it is possible to ease the complexity of the wiring such as the selection gate lines and the word lines in the region between the driver circuit 12 and the memory cell array 10 (the row decoders 11 are included).

8.2 Another Modified Example

In the embodiments described above, description is given where the optimum program voltages VPGM are different from each other according to the size of the memory cell transistor at the time of the write operation; however, the optimum values of the VCGRV which is applied to the selection gate line WL, the voltage VBL which is applied to the bit line BL, or the voltage VSL which is applied to the source line SL are different from each other according to the size of the memory cell transistors even in the read operation and these may be controlled respectively. The same also applies to the erasing operation.

In addition, in the embodiment described above, description is given using a case where the peripheral circuit 20 is provided between the memory cell array 10 and the semiconductor substrate as an example. However, the location of the peripheral circuit 20 is not limited to this. For example, the peripheral circuit 20 may be provided to be adjacent to the memory cell array 10. An example of such an arrangement is described, for example, in "Non-volatile Semiconductor Storage Device" in U.S. Pat. No. 7,933,151, filed Sep. 22, 2009; the entire contents of which are incorporated herein by reference.

Furthermore, in the first embodiment, description is given using a case where the memory hole 24 which passes through the word lines WL1 to WLn has the same diameter as the memory hole 24 which passes through the word lines WL(n+1) to WL(2n) as an example. However, both may be different from each other. For example, the diameter of the memory hole which passes through the word line WL1 may be different from the diameter of the memory hole which passes through the word line WL(2n) on the same layer as the word line WL1. For example, in the central section and the peripheral section (end section) of the memory cell array, there are cases where the processing shape is changed due to the influence of a photolithography technique or a dry etching technique, the sizes of the diameter D of the memory holes 24 are different from each other, or shapes where the taper angles are different from each other are intermixed. Accordingly, the configuration of the transistor 50 may be changed according to the shape of each of the memory holes 24.

Furthermore, the transistor size of the WL driver may be optimized. According to the present configuration, it is possible to reduce the area of the WL driver by also optimizing the size of the transistor which transfers the VPGM in the WL driver circuit in the same manner as the row decoders.

Furthermore, the selection gate line layer and the word line layer are processed as a batch; however, the layers may be processed separately. That is, the gate insulating film layer and the semiconductor layer may be formed in an inner section by processing the memory hole 24 which only passes through the word line layer and separately processing the contact hole of the selection gate line layer.

Furthermore, the transistor 50 is arranged in the gate width direction in the second embodiment; however, the transistor 50 may be arranged in the gate length direction and may also have another layout. In addition, a structure where two of the transistors 50 share a drain or a source is described; however, each one may be independent and a structure may be adopted where three or more of the transistors 50 share a drain or a source.

Furthermore, the NAND string is divided into three zones ZN in the third embodiment; however, it is sufficient if the NAND string is divided into two or more zones ZN. In addition, it is possible to arbitrarily set the group of the word lines WL which belong to each of the zones ZN and the program voltage VPGM which is transferred to each.

Furthermore, the memory hole is formed by being divided into two steps in the fourth embodiment; however, the number of steps may be increased to three or more steps.

Furthermore, the semiconductor layer 34a, the semiconductor layer 26, and a semiconductor layer 34b in FIG. 31 and FIG. 32 are formed separately in the sixth embodiment; however, the layers may be formed in a batch. That is, the block insulating layer 25a, the charge storage layer 25b, the tunnel insulating layer 25c, and the semiconductor layer 26 may be formed in an inner section by processing one memory hole 24 which passes through the selection gate line SGD, the word lines WL1 to WL8, and the selection gate line SGS layer from the upper layer.

Furthermore, in the sixth embodiment, the contact plugs 73 and 74 in FIG. 32 may be formed at a boundary portion of the block BLK and may be formed in a specific region in the block BLK.

Here, description is given where the shape is not limited to a simple shape in which the diameter is smaller as the memory hole is deeper in the first embodiment and the fifth embodiment. In addition, the seventh embodiment is not limited to a case where the width of the semiconductor layer 83 (a current path of the memory cell) is larger as the layer is lower. That is, the configuration is not limited as long as the size, that is, the current driving force (voltage transfer capacity) of the transfer transistor 50, is changed according to the characteristics of the memory cell transistor MT, without being limited to the layer where the corresponding word line WL is provided or the size of the memory cell transistor MT.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell transistor stacked above a semiconductor substrate;
   a second memory cell transistor stacked above the first memory cell transistor;
   first and second word lines electrically connected to gates of the first and second memory cell transistors, respectively; and
   a first transfer transistor electrically connected to the first word line and a second transfer transistor electrically connected to the second word line, wherein sizes of the first and second transfer transistors are different.

2. The device according to claim 1, wherein
   either or both of respective gate lengths and gate widths of the first and second transfer transistors are different.

3. The device according to claim 1, wherein
   a size of the first memory cell transistor is smaller than a size of the second memory cell transistor, and
   the size of the first transfer transistor is smaller than the size of the second transfer transistor.

4. The device according to claim 1, wherein
   a size of the first memory cell transistor is larger than a size of the second memory cell transistor, and
   the size of the first transfer transistor is larger than the size of the second transfer transistor.

5. The device according to claim 1, further comprising:
   a third memory cell transistor stacked above the second memory cell transistor;
   a third word line electrically connected to a gate of the third memory cell transistor; and
   a third transfer transistor electrically connected to the third word line, wherein
   a size of the second memory cell transistor is smaller than a size of the third memory cell transistor, and sizes of the second and third transfer transistors are the same.

6. The device according to claim 1, further comprising:
   a bit line and a source line between which the first and second memory cell transistors are electrically connected in series, wherein
   the bit line is farther from the semiconductor substrate than the first and second memory cell transistors, and the source line is farther from the semiconductor substrate than the first and second memory cell transistors.

7. The device according to claim 1, further comprising:
   a bit line and a source line between which the first and second memory cell transistors are electrically connected in series, wherein
   the bit line is farther from the semiconductor substrate than the first and second memory cell transistors, and the source line is closer to the semiconductor substrate than the first and second memory cell transistors.

8. A semiconductor memory device comprising:
a plurality of memory cell transistors that are stacked above a semiconductor substrate, the memory cell transistors having sizes that increase in proportion to a distance thereof to the semiconductor substrate;
a plurality of word lines, each of which is electrically connected to a gate of one of the memory cell transistors;
a plurality of word line driver circuits, each of which is configured to generate a voltage for one of the word lines; and
a plurality of transistors, each of which is electrically connected at a first end to one of the word line driver circuits and at a second end to one of the word lines, the transistors having sizes that increase in proportion to a distance of the memory cell transistor electrically connected thereto to the semiconductor substrate.

9. The device according to claim 8, wherein
the word lines are stacked above the semiconductor substrate, and
a semiconductor column extends through the word lines and a charge storage layer for the memory cell transistors is interposed between the semiconductor column and the word lines, sizes of the semiconductor column at intersections with the word lines increasing in proportion to a distance thereof to the semiconductor substrate.

10. The device according to claim 9, wherein
the semiconductor column has a substantially circular cross-section at each of the intersections with the word lines and diameters of the semiconductor column at intersections with the word lines increasing in proportion to the distance thereof to the semiconductor substrate.

11. The device according to claim 8, further comprising:
a bit line and a source line between which the memory cell transistors are electrically connected in series, wherein
the bit line is farther from the semiconductor substrate than the memory cell transistors, and the source line is farther from the semiconductor substrate than the memory cell transistors.

12. The device according to claim 8, further comprising:
a bit line and a source line between which the memory cell transistors are electrically connected in series, wherein
the bit line is farther from the semiconductor substrate than the memory cell transistors, and the source line is closer to the semiconductor substrate than the memory cell transistors.

13. The device according to claim 8, wherein
respective gate lengths of the transistors are different.

14. The device according to claim 8, wherein
respective gate widths of the transistors are different.

15. A semiconductor memory device comprising:
a plurality of memory cell transistors stacked above a semiconductor substrate, a first group of M memory cell transistors being closer to the semiconductor substrate than a second group of N memory cell transistors, where M and N are both greater than 1,
a plurality of word lines including a first word line electrically connected to a gate of one of the memory cell transistors in the first group and a second word line electrically connected to a gate of one of the memory cell transistors in the second group; and
a row decoder including a first transfer transistor electrically connected to the first word line and a second transfer transistor electrically connected to the second word line, wherein sizes of the first and second transfer transistors are different.

16. The device according to claim 15, wherein M is equal to N.

17. The device according to claim 15, wherein M is not equal to N.

18. The device according to claim 15, wherein
either or both of respective gate lengths and gate widths of the first and second transfer transistors are different.

19. The device according to claim 15, wherein
the size of the first transfer transistor is smaller than the size of the second transfer transistor.

20. The device according to claim 15, wherein
the size of the first transfer transistor is larger than the size of the second transfer transistor.

* * * * *